US012764911B2

(12) United States Patent
Musilli, Jr. et al.

(10) Patent No.: US 12,764,911 B2
(45) Date of Patent: Oct. 13, 2026

(54) SYSTEMS AND METHODS FOR AIR COOLING OF EQUIPMENT IN DATA CENTER CAMPUSES

(71) Applicant: Critical Project Services, LLC, Dallas, TX (US)

(72) Inventors: John A. Musilli, Jr., San Diego, CA (US); Matthew Douglas Koerner, Ashburn, VA (US); John Kolar, Clearwater, FL (US)

(73) Assignee: Critical Project Services, LLC, Dallas, TX (US)

( * ) Notice: Subject to any disclaimer, the term of this patent is extended or adjusted under 35 U.S.C. 154(b) by 863 days.

(21) Appl. No.: 18/056,236

(22) Filed: Nov. 16, 2022

(65) Prior Publication Data

US 2023/0156973 A1 May 18, 2023

Related U.S. Application Data

(60) Provisional application No. 63/308,468, filed on Feb. 9, 2022, provisional application No. 63/280,572, filed on Nov. 17, 2021.

(51) Int. Cl.
*H05K 7/20* (2006.01)

(52) U.S. Cl.
CPC ................................ *H05K 7/20745* (2013.01)

(58) Field of Classification Search
USPC ........................................................... 454/184
See application file for complete search history.

(56) References Cited

U.S. PATENT DOCUMENTS 4,874,127 A * 10/1989 Collier ............... H05K 7/20745 236/49.5
8,009,430 B2 * 8/2011 Claassen ............ H05K 7/20754 361/752

(Continued)

FOREIGN PATENT DOCUMENTS

CA 2904518 A1 * 4/2012
CA 2928808 A1 12/2015

(Continued)

OTHER PUBLICATIONS

Extended European Search Report issued Oct. 20, 2025 regarding Application No. 22896745.1, 10 pages.

(Continued)

*Primary Examiner* — Michael G Hoang
*Assistant Examiner* — Frances F. Hamilton

(57) ABSTRACT

A system includes multiple buildings including a first building and a second building disposed in close proximity to each other. Each of the buildings has a first end configured to receive ambient supply air from an exterior environment and a second end configured to output exhaust air to the exterior environment. Each of the buildings contains multiple computing devices. The computing devices in each building are configured to generate thermal energy that is transmitted to the supply air, thereby heating the supply air into the exhaust air before the exhaust air exits that building. The first end of the first building is a closest end to the second building and the first end of the second building is a closest end to the first building. The first end of the first building and the first end of the second building form portions of a supply air corridor between the first building and the second building.

15 Claims, 21 Drawing Sheets

(56) References Cited

U.S. PATENT DOCUMENTS

| | | | | |
|---|---|---|---|---|
| 8,251,785 | B2 * | 8/2012 | Schmitt | H05K 7/20745 705/28 |
| 8,469,782 | B1 * | 6/2013 | Roy | H05K 7/20745 62/119 |
| 9,915,453 | B2 | 3/2018 | Moses | |
| 10,280,900 | B1 * | 5/2019 | Krippene | F03D 3/0427 |
| 10,327,359 | B1 * | 6/2019 | Gao | H05K 7/20663 |
| 10,743,440 | B2 * | 8/2020 | Snip | H05K 7/20827 |
| 11,363,737 | B2 | 6/2022 | Rogers | |
| 2005/0122679 | A1 * | 6/2005 | Von Gutfeld | G06F 1/20 165/125 |
| 2008/0285232 | A1 | 11/2008 | Claassen et al. | |
| 2009/0241578 | A1 * | 10/2009 | Carlson | H05K 7/20745 361/690 |
| 2009/0251860 | A1 * | 10/2009 | Belady | H05K 7/1497 361/690 |
| 2011/0009047 | A1 * | 1/2011 | Noteboom | H05K 7/20745 454/258 |
| 2011/0083824 | A1 * | 4/2011 | Rogers | H05K 7/20754 312/236 |
| 2014/0157692 | A1 * | 6/2014 | Parizeau | E04H 5/00 52/173.1 |
| 2014/0160672 | A1 * | 6/2014 | Klaba | G06F 1/20 361/679.48 |
| 2014/0190191 | A1 * | 7/2014 | Slessman | H05K 7/20309 62/177 |
| 2014/0211411 | A1 * | 7/2014 | Slaby | F24F 7/08 454/67 |
| 2014/0345207 | A1 * | 11/2014 | Gliessman | E04D 13/0325 52/80.1 |
| 2015/0098177 | A1 * | 4/2015 | Wilcox | E04H 5/02 29/592 |
| 2016/0057894 | A1 * | 2/2016 | Chen | H05K 7/20745 361/679.46 |
| 2016/0076265 | A1 | 3/2016 | Parizeau et al. | |
| 2016/0249484 | A1 * | 8/2016 | Parizeau | H05K 7/20745 |
| 2017/0042067 | A1 * | 2/2017 | Parizeau | H05K 7/2079 |
| 2020/0042054 | A1 * | 2/2020 | Papen | F24F 7/06 |
| 2021/0315127 | A1 | 10/2021 | Goudreault et al. | |
| 2022/0167523 | A1 * | 5/2022 | Dumas | H05K 7/20172 |

FOREIGN PATENT DOCUMENTS

| | | | | | |
|---|---|---|---|---|---|
| CN | 102031891 | A | * | 4/2011 | |
| DE | 20205014 | U1 | * | 8/2002 | F24F 12/006 |
| EP | 2450641 | A2 | * | 5/2012 | F24F 1/0003 |
| GB | 2576571 | A | * | 2/2020 | H05K 7/20745 |
| GB | 2637167 | A | * | 7/2025 | H05K 7/1497 |
| SE | 534172 | C2 | * | 5/2011 | E04B 1/762 |
| WO | WO-2016058688 | A1 | * | 4/2016 | F24F 11/77 |

OTHER PUBLICATIONS

Yuan et al., "A study of hybrid ventilation in an institutional building for predictive control", Building and Environment, vol. 128, Jan. 2018, 11 pages.

International Search Report and Written Opinion issued Feb. 27, 2023 regarding International Application No. PCT/US2022/080081, 11 pages.

Wilson, "The Folly of Building-Integrated Wind", Apr. 2009, 23 pages. https://www.buildinggreen.com/feature/folly-building-integrated-wind.

"Air-mixing plenum", Wikipedia, Dec. 13, 2021, 2 pages. https://en.wikipedia.org/wiki/Air-mixing_plenum.

Konrad, J., "Wind Turbine Designs—The 11 Most Interesting", Jul. 13, 2010, 6 pages. https://gcaptain.com/the-most-interesting-wind-turbine-designs/.

* cited by examiner

SYSTEMS AND METHODS FOR AIR COOLING OF EQUIPMENT IN DATA CENTER CAMPUSES

CROSS-REFERENCE TO RELATED APPLICATIONS AND PRIORITY CLAIM

This application claims priority under 35 U.S.C. § 119(e) to U.S. Provisional Patent Application No. 63/280,572 filed on Nov. 17, 2021, and to U.S. Provisional Patent Application No. 63/308,468 filed on Feb. 9, 2022, both of which are hereby incorporated by reference in their entirety.

TECHNICAL FIELD

Embodiments of the present disclosure relate to data centers and, in particular, to systems and methods for improved air cooling of equipment in data center campuses.

BACKGROUND

Most data centers are a single story building due in large part to the large amount of physical infrastructure required for cooling. This infrastructure includes, but is not limited to, cooling towers, chillers, pipe work, and air handling units, all used individually or in some combination to reject the heat from the data center computing equipment. Some data centers feature multiple single-story or multi-story buildings arranged close to each other in a campus configuration. Some of these data centers use unconditioned outside air delivered to the computer equipment at a prescribed temperature and relative humidity with little or no mechanical cooling.

SUMMARY

This disclosure provides systems and methods for improved air cooling of equipment in data center campuses.

In a first embodiment, a system includes multiple buildings including a first building and a second building disposed in close proximity to each other. Each of the buildings has a first end configured to receive ambient supply air from an exterior environment and a second end configured to output exhaust air to the exterior environment. Each of the buildings contains multiple computing devices. The computing devices in each building are configured to generate thermal energy that is transmitted to the supply air, thereby heating the supply air into the exhaust air before the exhaust air exits that building. The first end of the first building is a closest end to the second building and the first end of the second building is a closest end to the first building. The first end of the first building and the first end of the second building form portions of a supply air corridor between the first building and the second building.

In a second embodiment, a method includes, at each of multiple buildings including a first building and a second building disposed in close proximity to each other: (i) receiving ambient supply air from an exterior environment at a first end and outputting exhaust air to the exterior environment at a second end, each of the buildings containing multiple computing devices, (ii) generating thermal energy by multiple computing devices disposed in that building; and (iii) transmitting the thermal energy to the supply air, thereby heating the supply air into the exhaust air before the exhaust air exits that building. The first end of the first building is a closest end to the second building and the first end of the second building is a closest end to the first building. The first end of the first building and the first end of the second building form portions of a supply air corridor between the first building and the second building.

Other technical features may be readily apparent to one skilled in the art from the following figures, descriptions, and claims.

DETAILED DESCRIPTION

The figures discussed below and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include any one, more than one, or all of the features described here. Also, embodiments of this disclosure may additionally or alternatively include other features not listed here.

As discussed above, most data centers are a single story building due in large part to the large amount of physical infrastructure required for cooling. This infrastructure includes, but is not limited to, cooling towers, chillers, pipe work, and air handling units, all used individually or in some combination to reject the heat from the data center computing equipment. However, some data centers feature multiple multi-story buildings arranged close to each other in a campus configuration. Most of these data centers rely on traditional liquid fluid transfer between cooling components, such as air to fluid transfer and delivery of the heated fluid to the outside atmosphere to be rejected through evaporation, phase change or liquid to air transfer. The physical weight and use of pump energy to move the liquids involves higher construction costs for structural building components and liquid pump energy use.

To address these and other issues, embodiments of the present disclosure feature multi-story modular and air side economization techniques that reduce or eliminate the need for traditional liquid fluid transfer between cooling components. The disclosed embodiments also feature techniques for data center campus hot and cold corridor building isolation. Such techniques take the hot and cold aisle concepts typically applied to rack arrangements and expand the concepts to the building site or data center campus footprint. The disclosed embodiments reduce or eliminate the hot air infiltration into the supply air stream. Other benefits will be apparent to those of skill in the art.

Figure 1A:
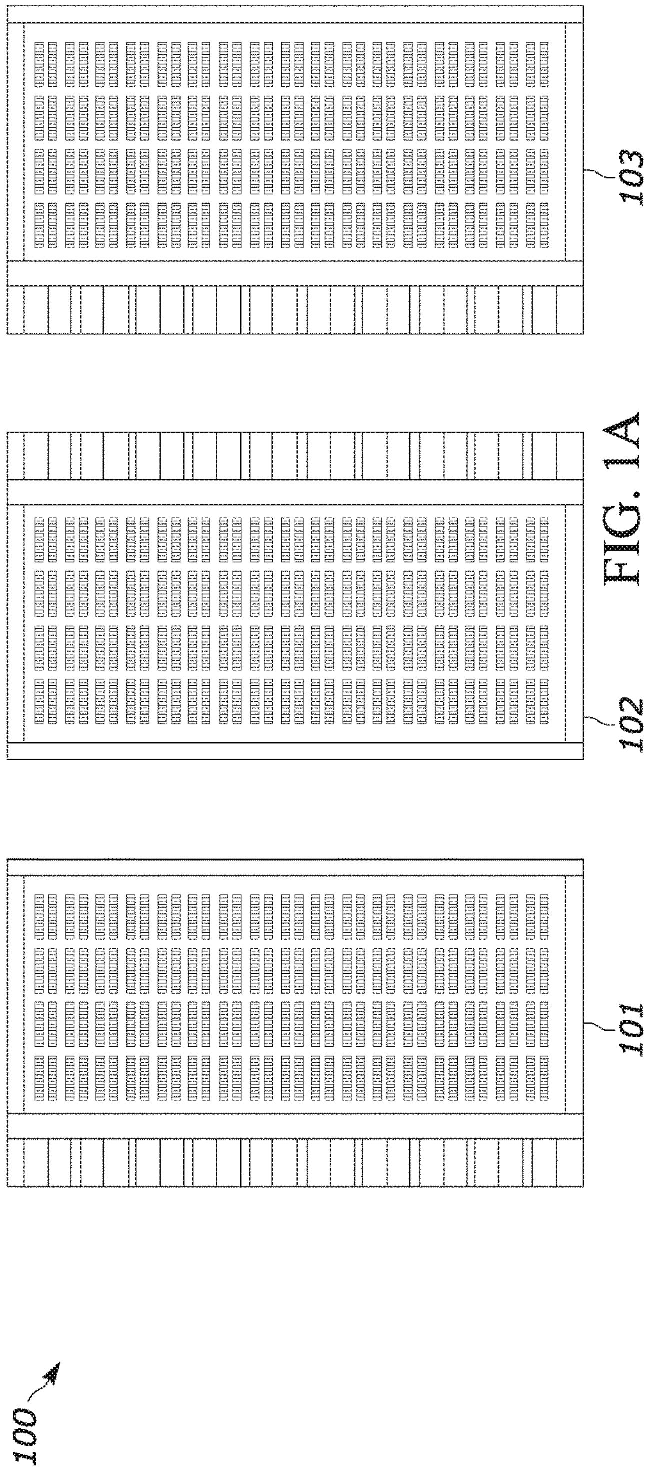
FIGS. 1A and 1B illustrate an example data center campus in which one or more methods for improved air cooling of equipment can be employed according to various embodiments of the present disclosure.
Figure 1B:
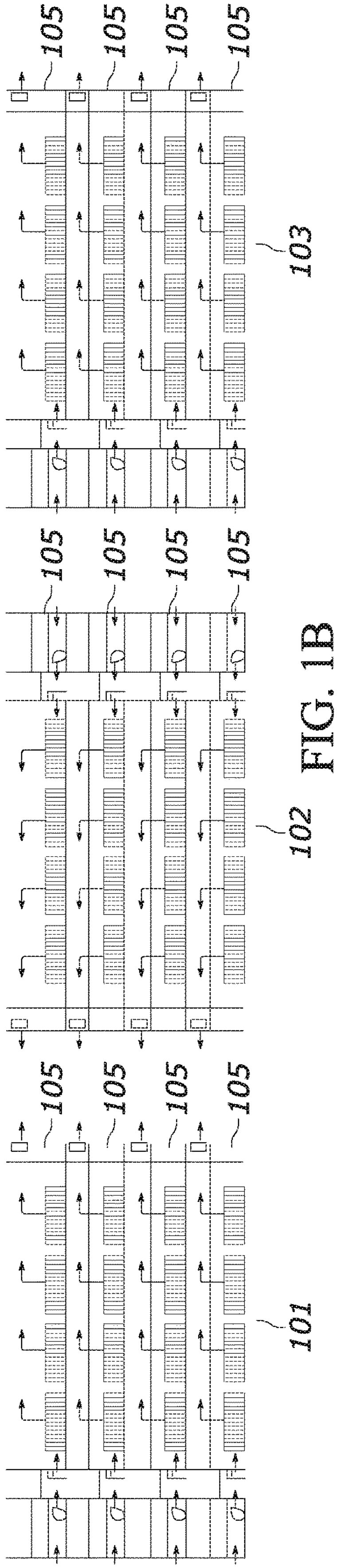

FIGS. 1A and 1B illustrate an example data center campus 100 in which one or more methods for improved air cooling of equipment can be employed according to various embodiments of the present disclosure. In particular, FIG. 1A shows a plan view of the campus 100, and FIG. 1B shows an elevation view of the campus 100. The embodiment of the campus 100 shown in FIGS. 1A and 1B is for illustration only. Other embodiments of the campus 100 could be used without departing from the scope of this disclosure.

As shown in FIGS. 1A and 1B, the campus 100 includes multiple buildings 101-103 arranged in close proximity to each other. Each building 101-103 is a multi-story building. As shown in FIGS. 1A and 1B, the campus 100 includes three buildings 101-103 that are each four stories high. Of course, these are merely examples; other campuses could include other numbers of buildings with other numbers of floors.

As used herein, the terms "close" and "close proximity" in reference to building placement indicates buildings that are close enough together that the pattern of movement of air between the buildings is affected by the physical presence of the buildings. An extreme example of this is the "air tunnel" phenomenon observed between skyscrapers in urban cores. In some embodiments, "close" may indicate multiple buildings whose distance apart is less than the height of one or more of the buildings. In some embodiments, close may indicate multiple buildings whose distance apart is less than 100 feet. In some embodiments, close may indicate multiple buildings whose distance apart is less than 50 feet. In some embodiments, close may indicate multiple buildings whose distance apart is less than 20 feet. Other distances may be relevant depending on the size, number, height, arrangement, and/or layout of the buildings.

The buildings 101-103 feature a multi-story modular design that reduces or eliminates the need for traditional liquid fluid transfer between cooling components that, in most cases, relies on air to fluid transfer and delivery of the heated fluid to the outside atmosphere to be rejected through evaporation, phase change, or liquid to air transfer. As described in greater detail below, the buildings 101-103 incorporate a cooling system that uses outside air for primary cooling in an open loop configuration. Such a system can reduce upfront and recurring costs over conventional systems. In some embodiments, the highest consumable costs of the system are air filters that clean the ambient air to the prescribed particulate standard(s). Any use of this filtered air more than once within one or more of the buildings 101-103 is a direct cost benefit for operations. In addition, the air reuse topology provides lower operating costs for fan power, which can result in a high efficiency, low cost data center to build and operate.

Figure 2:
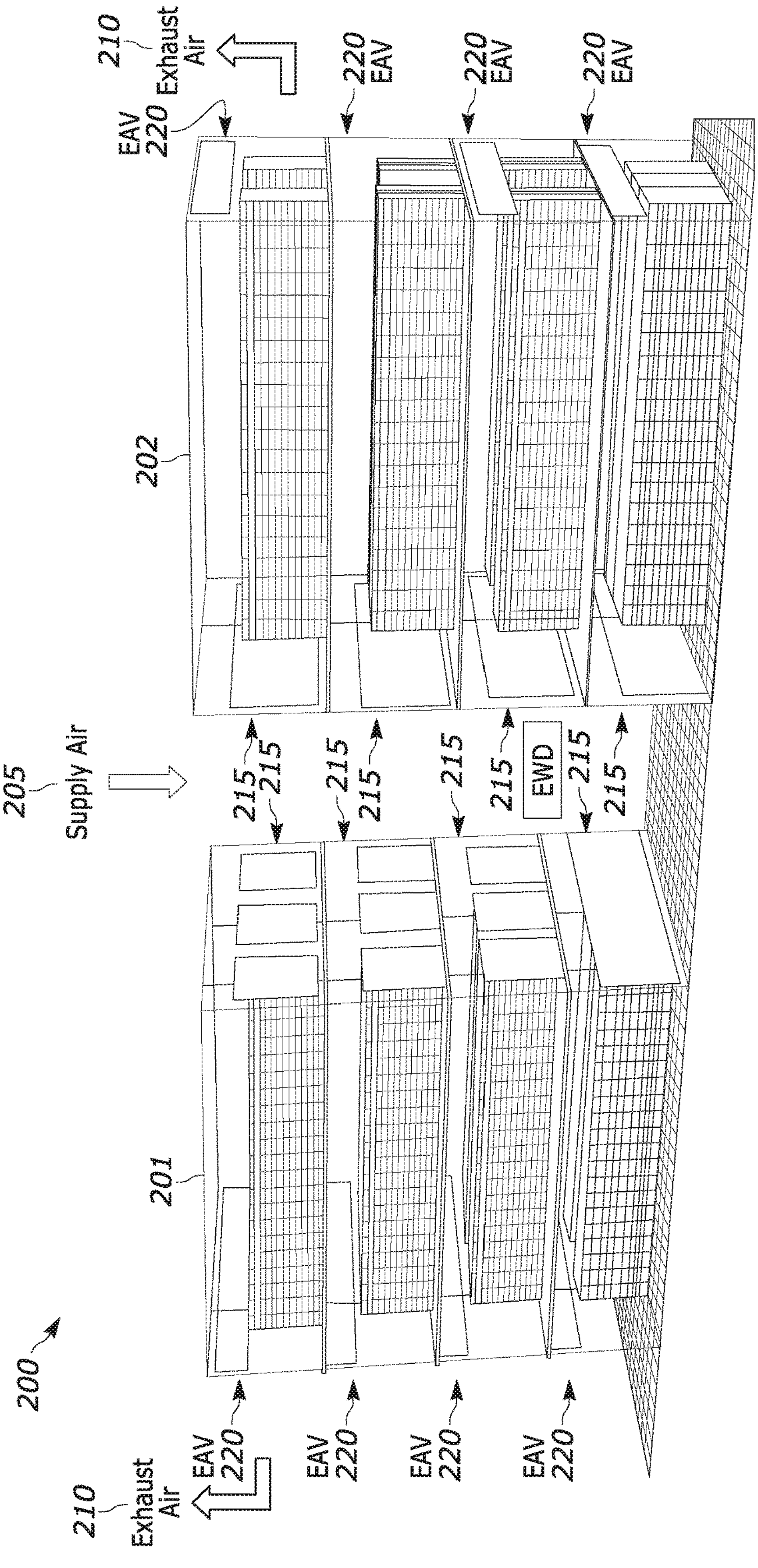
FIG. 2 illustrates another example data center campus in which one or more methods for improved air cooling of equipment can be employed according to various embodiments of the present disclosure.

FIG. 2 illustrates another example data center campus 200 in which one or more methods for improved air cooling of equipment can be employed according to various embodiments of the present disclosure. In some embodiments, the campus 200 can represent (or be represented by) the campus 100 of FIGS. 1A and 1B. The embodiment of the campus 200 shown in FIG. 2 is for illustration only. Other embodiments of the campus 200 could be used without departing from the scope of this disclosure.

As shown in FIG. 2, the campus 200 includes multiple buildings 201-202 arranged in close proximity to each other. Each building 201-202 is a multi-story building. In some embodiments, the buildings 201-202 can represent (or be represented by) the buildings 101-103 of FIGS. 1A and 1B. In FIG. 2, the campus 200 includes two buildings 201-202 that are each four stories high. Of course, these are merely examples; other campuses could include other numbers of buildings with other numbers of floors.

In the campus 200, supply air 205 enters each building 201-202 at one end or side, and exhaust air 210 exits each building 201-202 at an opposite end or side. The supply air 205 is used to cool computing devices (e.g., servers) and other heat generating equipment housed within each building 201-202. The supply air 205 may include direct outside air (i.e., air side economization), with little or no thermal or humidity conditioning. In some embodiments, the supply air 205 can be drawn or pulled into the supply air space of each building 201-202 by mechanical means (e.g., one or more fans). In some embodiments, the supply air 205 can be driven or pushed into the supply air space of each building 201-202 by mechanical means (e.g., one or more fans). In some embodiments, the supply air 205 can be drawn into the supply air space of each building 201-202 without any mechanical assistance other than fans associated with the data center computing devices.

The supply air 205 entering each building 201-202 may enter from one or more locations on the exterior of each building 201-202. As shown in FIG. 2, the supply air 205 enters each building 201-202 through multiple exterior wall dampers 215 disposed at one end or side of each building 201-202. In some embodiments, the end or side of each building 201-202 in which the wall dampers 215 are disposed is the end or side that is closest to the adjacent building 201-202. The exterior wall dampers 215 are located at each floor of each building 201-202. Of course, this is merely one example. In other embodiments, the supply air 205 may enter each building 201-202 through any wall, roof, or floor location(s), or a combination thereof. Also, the dampers 215 can represent any suitable grill, louver, duct, damper, or combination thereof, for allowing or controlling passage of air.

Once inside each building 201-202, the supply air 205 moves to and around the data center equipment located in each building 201-202 in order to receive thermal energy generated by the equipment, thereby acting to cool the equipment. The supply air 205 that reaches the equipment may include direct outside air that can be controllably mixed with warm to hot air from the hot air plenum, mixing and recirculation into the data center supply air aisle. That is, the outside supply air 205 may be mixed or blended with the data center equipment warm air or hot air stream. The mixing or blending could benefit the data center supply air needs by providing a specific range of supply air thermal value or relative humidity of the supply air 205.

As discussed above, in some embodiments, the supply air 205 is primarily or entirely ambient air that has not been conditioned. In some embodiments, design requirements or operational requirements may indicate that the supply air 205 entering one or more buildings 201-202 from outside may be conditioned, such as through a direct evaporative process. The direct evaporative process may be used to cool the incoming ambient supply air 205 prior to reaching the supply air aisle of the data center equipment. In some embodiments, the direct evaporative cooling process may include direct air to liquid thermal transfer at the data center walls, roof, floor, or a combination of these.

Additionally or alternatively, in some embodiments, the supply air 205 entering one or more buildings 201-202 from outside may be conditioned using mechanical means. The mechanical means can include heat rejection that is performed remote to the data center. In some embodiments, the supply air 205 may pass over a coil, membrane, or tube assembly configured to collect thermal energy (heat) from the supply air 205, through an air to surface contact. The collected thermal energy may be transported as liquid or a gas to a remote heat rejection location, such as a remote heat sink. The remote heat rejection may be in the form of evaporative, phase change, adiabatic, or a combination of these.

The exhaust air 210, which comprises heated air exhausted from the data center computing devices, can be collected in a plenum segregated from the supply air 205 and may be exhausted from each building 201-202 through one or more exhaust air vents 220 into the atmosphere. The supply air 205 and the exhaust air 210 may be deployed in segregated paths within the building 201-202 or room. In some embodiments, the only ways for the supply air 205 to communicate with the exhaust air 210 is through the data center computing equipment, through one or more passive uncontrolled vents and openings, or through one or more controlled active vents, dampers, and/or mixing chambers supported by fans.

The segregation of the exhaust air 210 from the supply air 205 can be important for achieving temperature control and high efficiency operations. In some embodiments, the air segregation can be achieved through a robust system of separator panels, screens, barriers, doors, air sealing components, or the like, between the supply side and exhaust side of the data center airflows. Such separators may be formed of rigid or flexible materials. The separators may be solid or perforated to prevent or allow airflow between the supply and exhaust side. In some embodiments, the air segregation uses a robust system with low leakage rates, e.g., <2%@0.5 in. WC (Inches Water Column), into or out of the different sides of each building 201-202.

The exhaust air vents 220 comprise openings in each building 201-202. In FIG. 2, the exhaust air vents 220 are disposed at one end or side of each building 201-202. The exhaust air vents 220 are located at each floor of each building 201-202. Of course, this is merely one example. In other embodiments, the exhaust air 210 may leave each building 201-202 through any wall, roof, or floor location(s), or a combination thereof.

In some embodiments, the heated exhaust air 210 leaving the data center equipment can be drawn or pulled into the data center exhaust air space by mechanical means (e.g., one or more fans). In some embodiments, the heated exhaust air 210 can be driven or pushed into the data center exhaust air space by mechanical means (e.g., one or more fans). In some embodiments, the heated exhaust air 210 can be drawn into the exhaust air space without any mechanical assistance other than fans associated the data center computing devices. In some embodiments, the heated exhaust air 210 may use convection in whole or in part to move the air stream though one of the buildings 201-202.

The exhaust air 210 can be used in a single use application in which the exhaust air 210 exits into a designed hot air exhaust area between buildings, and does not mix with supply air entering a space, floor(s) or building. In other embodiments, the exhaust air 210 can be mixed with the entering ambient supply air 205 to meet one or more data center supply air requirements for temperature and relative humidity. Various techniques can be implemented to mix exhaust air 210 and supply air 205, including but not limited to (i) one or more controlled dampers that open to allow the passive introduction of the exhaust air 210 into the supply air path, (ii) one or more controlled dampers with fans that provide active introduction of the exhaust air 210 into the supply air path, and (iii) one or more mixing boxes that blend the supply air 205 and the exhaust air 210 to precise values specific to temperature and relative humidity prior to entering the data center space, floor, or building 201-202.

Figure 3:
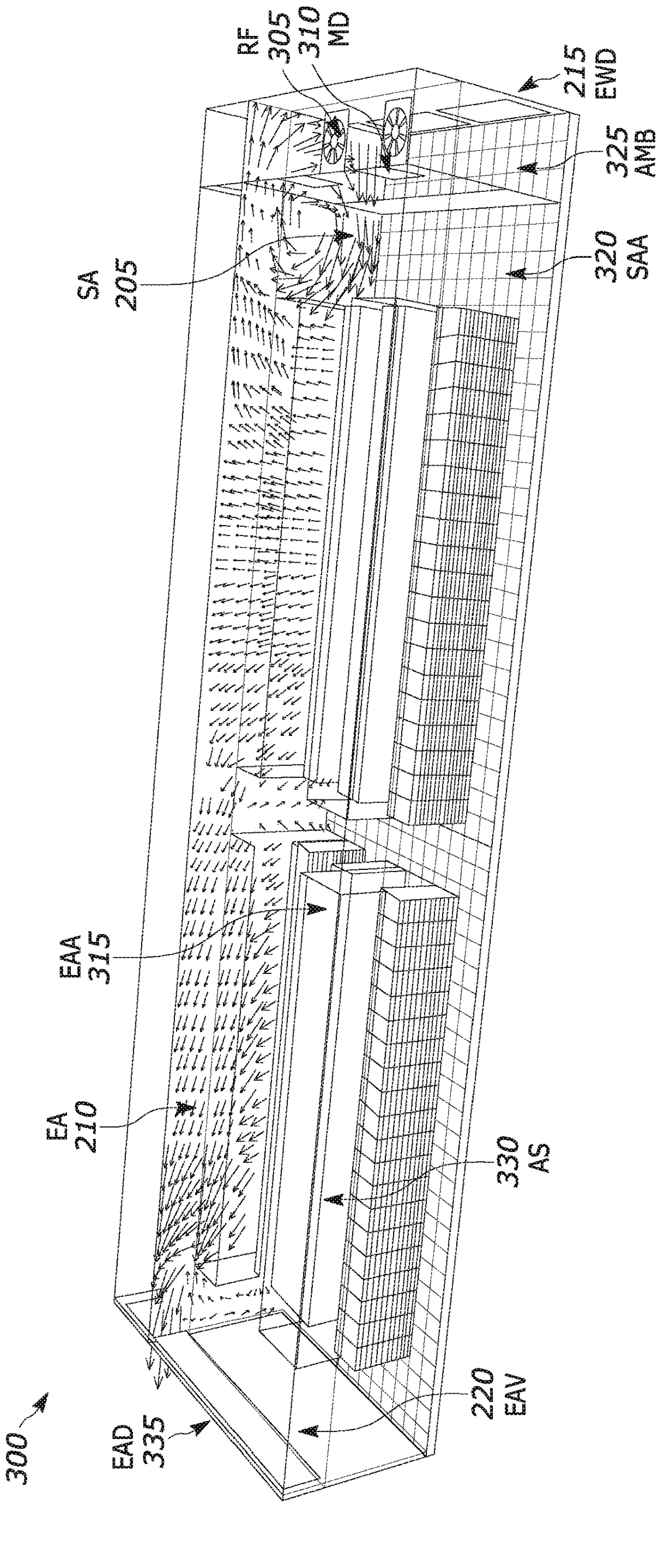
FIG. 3 illustrates an example mixing box that can be used in conjunction with the data center campus of FIG. 2.

FIG. 3 illustrates an example mixing box 300 that can be used in conjunction with the data center campus 200 of FIG. 2. In particular, the mixing box 300 represents a customized mixing box that can be installed inside the exterior walls of one of the buildings 201-202. In some embodiments, the mixing box 300 can be coupled to one or more of the exterior wall dampers 215. The embodiment of the mixing box 300 shown in FIG. 3 is for illustration only. Other embodiments of the mixing box 300 could be used without departing from the scope of this disclosure.

As shown in FIG. 3, the mixing box 300 and auxiliary components and space elements include one or more recirculation fans 305, one or more mixing dampers 310, one or more exhaust air aisle 315 openings, one or more supply air aisle 320 openings, one or more air mixing boxes 325, one or more air segregation system 330 openings, and one or more exhaust air dampers 335. Mixing boxes and their components are described in greater detail below.

In many implementations, data centers are designed and operated in accordance with various industry standards. Such standards help to ensure consistent and safe operation of data center computing equipment. Many of the standards for air temperature and relative humidity inside the data center are promulgated by the American Society of Heating, Refrigerating and Air-Conditioning Engineers (ASHRAE). ASHRAE commonly uses two sets of thermal guidelines for data centers: Recommended (e.g., temperature range of 18-27° C. (64-81° F.)), and Allowable (temperature range of 5 to 45° C. (41 to 113° F.)).

Because computer equipment can operate at a wide range of supply air temperatures, many co-location and cloud data center customers and clients require the data center service providers to use ASHRAE Recommended guidelines. This lower supply air temperature for the data center compute equipment will generate a lower exhaust air temperature and, in many cases, this exhaust air temperature is still acceptable for reuse as supply air based on the ASHRAE Recommended or Allowable supply air temperature range. This proportional low exhaust air temperature range provides opportunities to reuse the exhaust air stream as supply air to other areas, floors, or buildings. The use of outside air and the recirculation of the exhaust air or blending or serial use can provide high efficiency and lower operation cost.

In some embodiments, exhaust air can be reused, in a serial flow, as supply air to adjacent areas or floors or buildings when the thermal content (temperature) of the exhaust air meets the supply air requirements of the adjacent (downstream) space. The exhaust air from one enclosure, area, floor, or building may be directed to the floor above in a multi-story building, e.g., through a passive common floor grate open to the exhaust air plenum or space below. In some embodiments, the exhaust air may be directed through an automated floor grate that opens when the supply air temperature requirements are met for the space above. In some embodiments, the exhaust air may be directed through one or more controlled dampers with fans that provided active introduction of the exhaust air into the supply air path. In some embodiments, the exhaust air may be directed to other areas, floors or buildings through dampers, fans, ductwork, or a combination of these.

Figure 4:
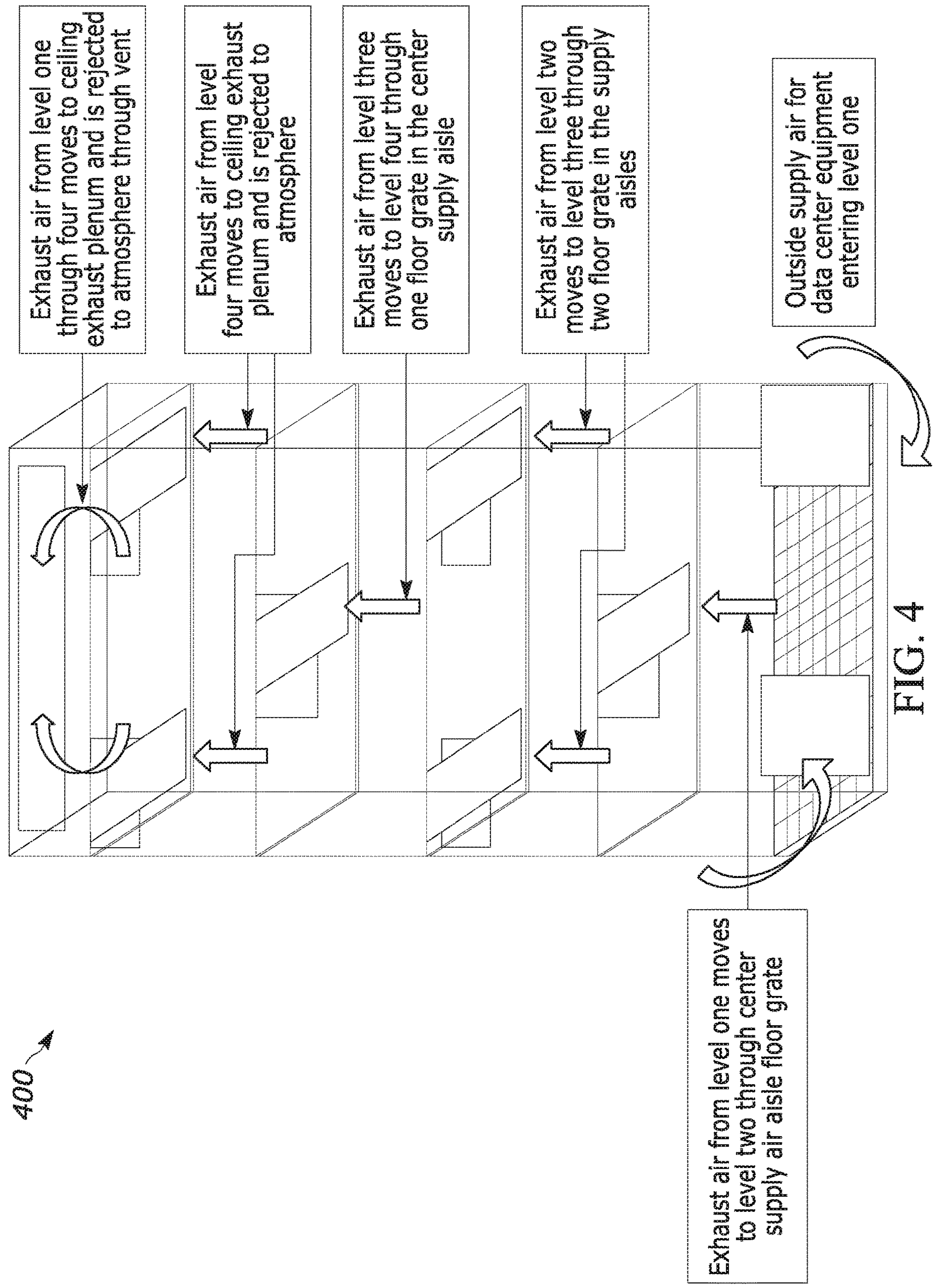
FIG. 4 illustrates an example building in which exhaust air is reused according to various embodiments of the present disclosure.

FIG. 4 illustrates an example building 400 in which exhaust air is reused according to various embodiments of the present disclosure. In some embodiments, the building 400 can represent (or be represented by) one of the buildings 201-202 of FIG. 2. The embodiment of the building 400 shown in FIG. 4 is for illustration only. Other embodiments of the building 400 could be used without departing from the scope of this disclosure.

As shown in FIG. 4, outside supply air enters the building at level one. The supply air can be used to cool data center equipment in level one. The exhaust air from level one moves to level two through a floor grate or temperature controlled dampers in the center supply air aisle of level two. This air can be used to cool data center equipment in level two. The exhaust air from level two moves to level three through two floor grates in the supply air aisles of level three. This air can be used to cool data center equipment in level three. The exhaust air from level three moves to level four through a floor grate in the center supply air aisle of level four. This air can be used to cool data center equipment in level four. The exhaust air from level four moves to the ceiling exhaust plenum in order to be rejected to the atmosphere. From the ceiling exhaust plenum, the exhaust air is rejected to the atmosphere through one or more vents.

Figure 5:
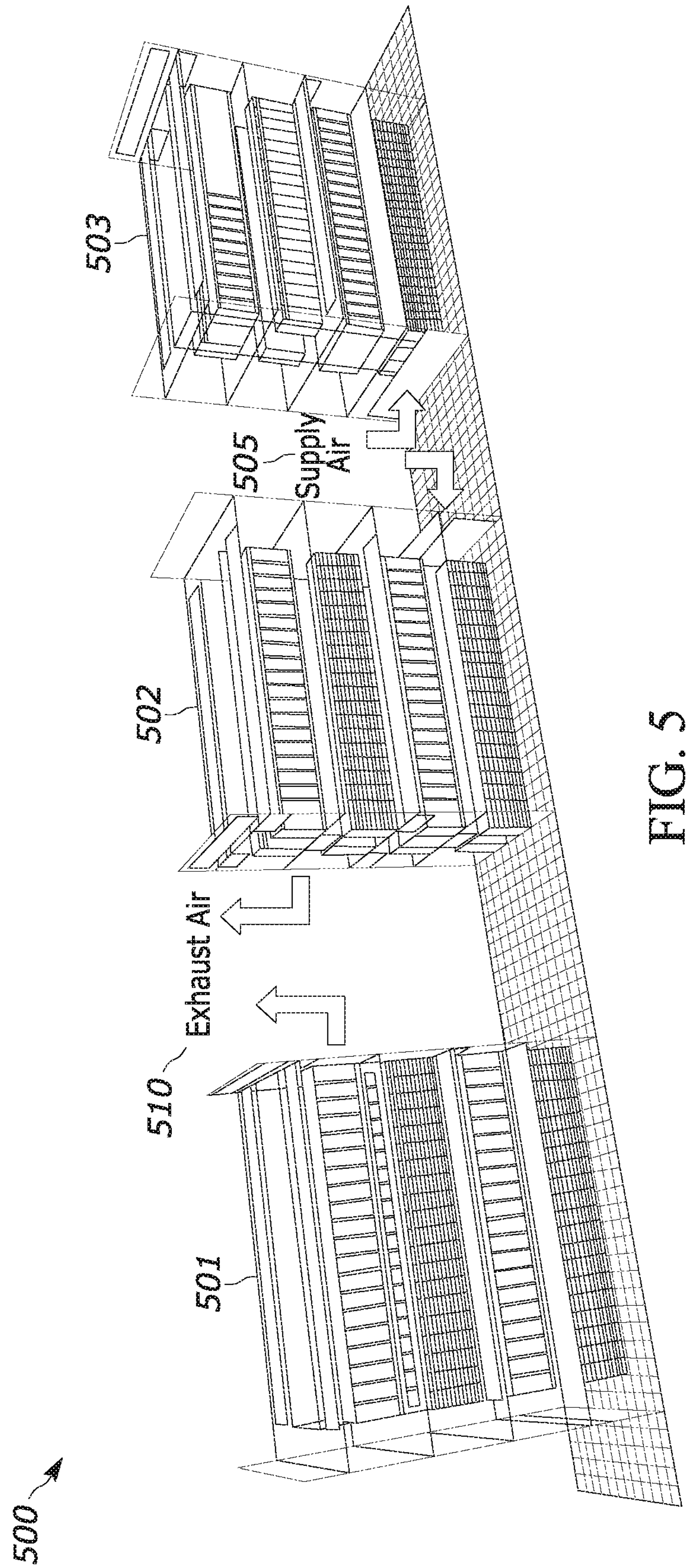
FIG. 5 illustrates another example data center campus in which exhaust air is reused according to various embodiments of the present disclosure.

FIG. 5 illustrates another example data center campus 500 in which exhaust air is reused according to various embodiments of the present disclosure. In some embodiments, the campus 500 can represent (or be represented by) the campus 200 of FIG. 2. The embodiment of the campus 500 shown in FIG. 5 is for illustration only. Other embodiments of the campus 500 could be used without departing from the scope of this disclosure.

As shown in FIG. 5, the campus 500 includes multiple buildings 501-503 arranged in close proximity to each other. Each building 501-503 is a multi-story building. In some embodiments, the buildings 501-503 can represent (or be represented by) the buildings 101-103 of FIGS. 1A and 1B. In FIG. 5, the campus 500 includes three buildings 501-503 that are each four stories high. Of course, these are merely examples; other campuses could include other numbers of buildings with other numbers of floors.

In the campus 500, each building 501-503 includes hot and cold corridors on each floor. Supply air 505 enters each building 501-503 at the lowest floor, is used or reused for cooling computing equipment on one or more floors, such as described in FIG. 4, and is then exhausted as exhaust air 510 from the top floor or ceiling.

In some embodiments, in multi-story buildings, the data center equipment racks may be placed in alternating configurations on each floor with respect to the supply air side of the equipment.

Figure 6:
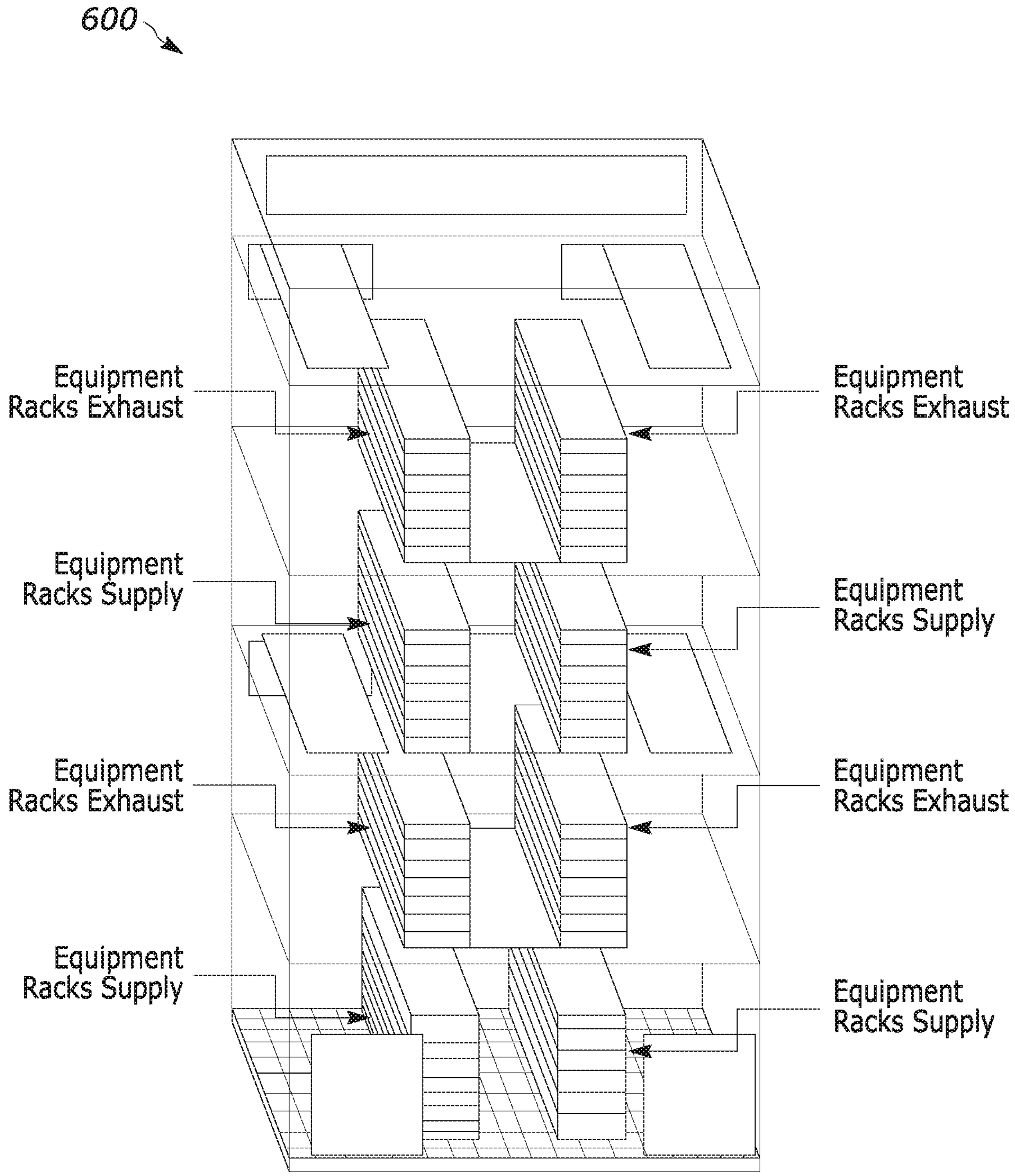
FIG. 6 illustrates an example building in which data center equipment is arranged in alternating configurations according to various embodiments of the present disclosure.

FIG. 6 illustrates an example building 600 in which data center equipment is arranged in alternating configurations according to various embodiments of the present disclosure. In some embodiments, the building 600 can represent (or be represented by) the building 400 of FIG. 4. The embodiment of the building 600 shown in FIG. 6 is for illustration only. Other embodiments of the building 600 could be used without departing from the scope of this disclosure.

As shown in FIG. 6, the building 600 includes data center equipment arranged in racks on each floor. The supply air side and the exhaust air side of each rack alternates from one floor to an adjacent floor. The alternating configuration provides a supply air path to the equipment on the upper floor from the exhaust air path of the floor and equipment below. The passage of exhaust air to the next floor supply side can continue until the air temperature exceeds the prescribed requirements. The exhaust air may be rejected from the building 600 to the atmosphere through an exhaust damper at each floor, or may be disposed on the top floor or the roof of the building 600. In some embodiments, the exhaust air may be directed to a mixing box (e.g., the mixing box 300) to blend with incoming ambient supply air.

The control of thermal value and relative humidity of supply air in conventional data centers is typically provided by some means of mechanical cooling or evaporative cooling. Conventional air management systems are usually closed loop, except for outside air introduction, (sometimes referred to as "make-up air"), for space or building pressurization to prevent infiltration of dirty or unconditioned air. The make-up air system also provides a minimum amount of fresh air required by building codes for occupant's well-being.

A system that uses direct outside air as supply and then exhausts to atmosphere, such as described in FIGS. 1A through 6, is considered an open loop system. The ability to tightly control the supply air thermal and relative humidity values can be achieved using one or more control sensors, controlled actuators, and calculations to provide the correct balance of supply air thermal content and humidity. In some embodiments, a partial closed loop can be employed during periods when outside ambient air does not meet the prescribed thermal and or relative humidity values.

In some embodiments, a mixing box (e.g., the mixing box 300) can be used to achieve control of thermal and relative humidity values of the supply air. In other embodiments, exhaust air can be directly introduced to the supply air aisle, using a non-mixing box topology. Exhaust air may be directly introduced into the supply air stream through the simple opening of a damper in the air segregation system adjacent to, above, or below the supply air aisle. The damper may be automated, gravity operated, or manual in operation.

Figure 7:
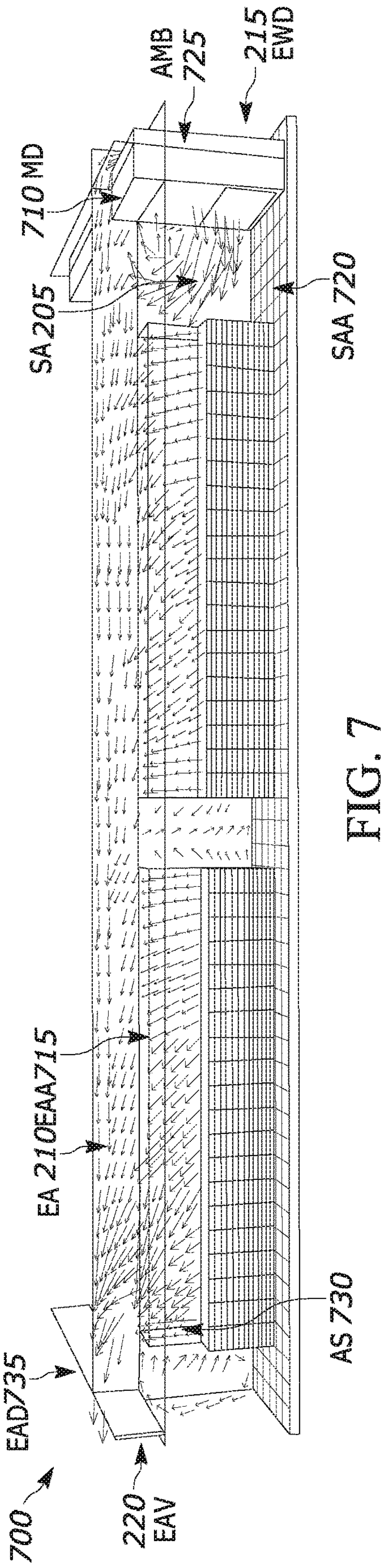
FIG. 7 illustrates another example mixing box that can be used in conjunction with one or more of the data center campuses described herein, according to various embodiments of the present disclosure.
Figure 8:
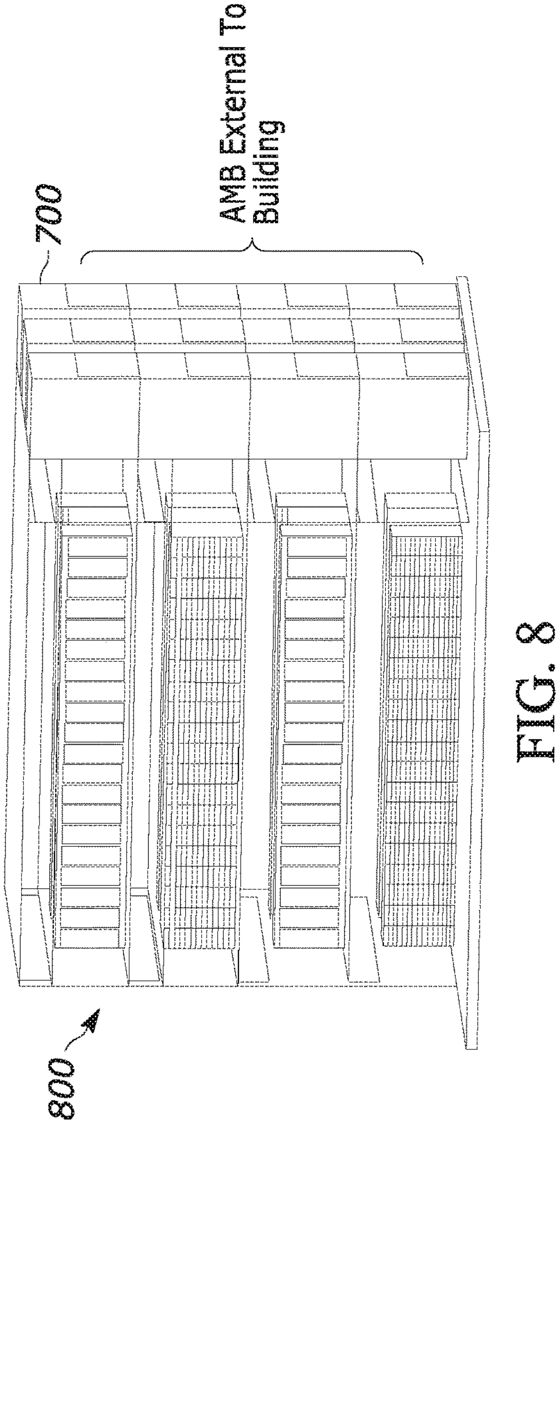
FIG. 8 illustrates an example building on which multiple mixing boxes are installed according to various embodiments of the present disclosure.

FIG. 7 illustrates another example mixing box 700 that can be used in conjunction with one or more of the data center campuses described herein, according to various embodiments of the present disclosure. In particular, the mixing box 700 represents an air mixing box that can be installed external to one of the buildings. FIG. 8 illustrates an example building 800 on which multiple mixing boxes 700 are installed according to various embodiments of the present disclosure. The embodiment of the mixing box 700 shown in FIG. 7 is for illustration only. Other embodiments of the mixing box 700 could be used without departing from the scope of this disclosure.

As shown in FIG. 7, the mixing box 700 includes multiple components and auxiliary space elements that are the same as, or similar to, corresponding components of the mixing box 300 of FIG. 3. The mixing box 700 includes one or more mixing dampers 710, one or more exhaust air aisle 715 openings, one or more supply air aisle 720 openings, one or more air mixing boxes 725, one or more air segregation system 730 openings, and one or more exhaust air dampers 735.

The mixing box 700 provides controlled mixing or blending of the ambient supply air 205 with the scavenged exhaust air 210 from the exhaust air plenum directly or through duct work. In some embodiments, the controlled mixing is performed passively using controlled or gravity dampers without fans. In some embodiments, the controlled mixing is performed actively using controlled or gravity dampers with fans. The mixing box 700 can mix the exhaust air 210 with the supply air 205 to raise the ambient supply air temperature to a prescribed level, e.g., between 64° F. and 113° F. The mixing box 700 can also change the relative humidity of the ambient supply air 205 by mixing with the dry exhaust air 210 to meet prescribed levels, e.g., between 5% and 95% non-condensing.

The mixing box 700 can be formed in various shapes, sizes, and configurations. In some embodiments, the mixing box 700 may be deployed as a single unit as small as approximately 4 cubic feet. In some embodiments, the mixing box 700 may be modular sized up to 5000 cubic feet or more. Of course, other sizes are possible and within the scope of this disclosure. The mixing box 700 may be built on-site and customized in size to correspond to the length, width or height of a building and a depth per design requirements. The mixing box 700 may include multiple units working independently of each other for large scale deployment requiring different thermal and humidity values. For example, as shown in FIG. 8, the building 800 includes multiple mixing boxes 700 disposed on each floor of the building 800. In some embodiments, the mixing box 700 may include multiple units ganged together for large scale deployment, per the requirements of a space, floor, or building. The mixing box 700 may be attached directly to a building wall, roof, or floor element. The mixing box 700 may be supported or mounted to hang on another structural element.

In some embodiments, the mixing box 700 can be a standalone component or structure that contain required subcomponents, including fans, dampers, filters, duct connection points, sensors, controls, plumbing, electrical, and the like. In other embodiments, the mixing box 700 can be a simple shell to allow the exhaust air 210 and the ambient supply air 205 to mix in an unregulated process.

Figure 9:
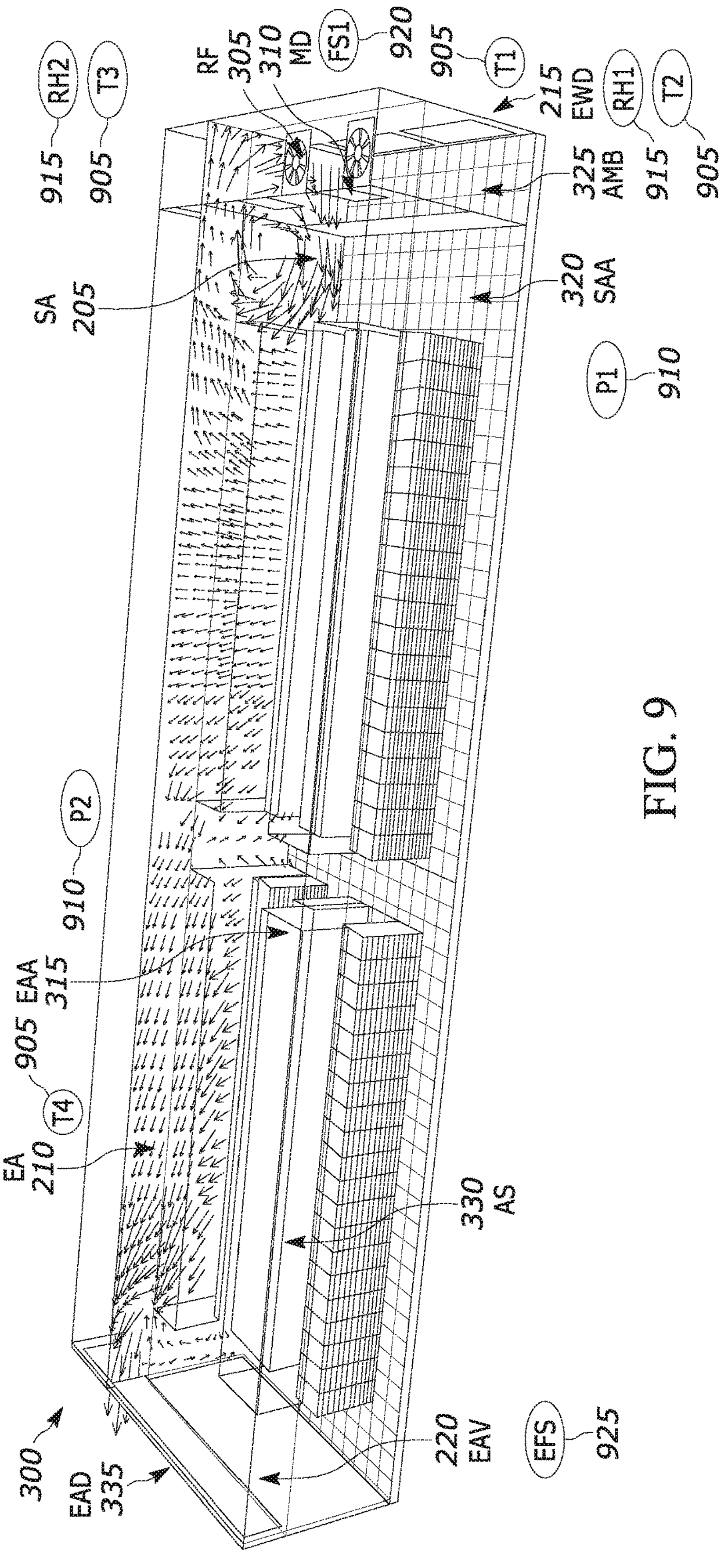
FIG. 9 illustrates the mixing box of FIG. 3 with multiple example controls according to various embodiments of the present disclosure.
Figure 10:
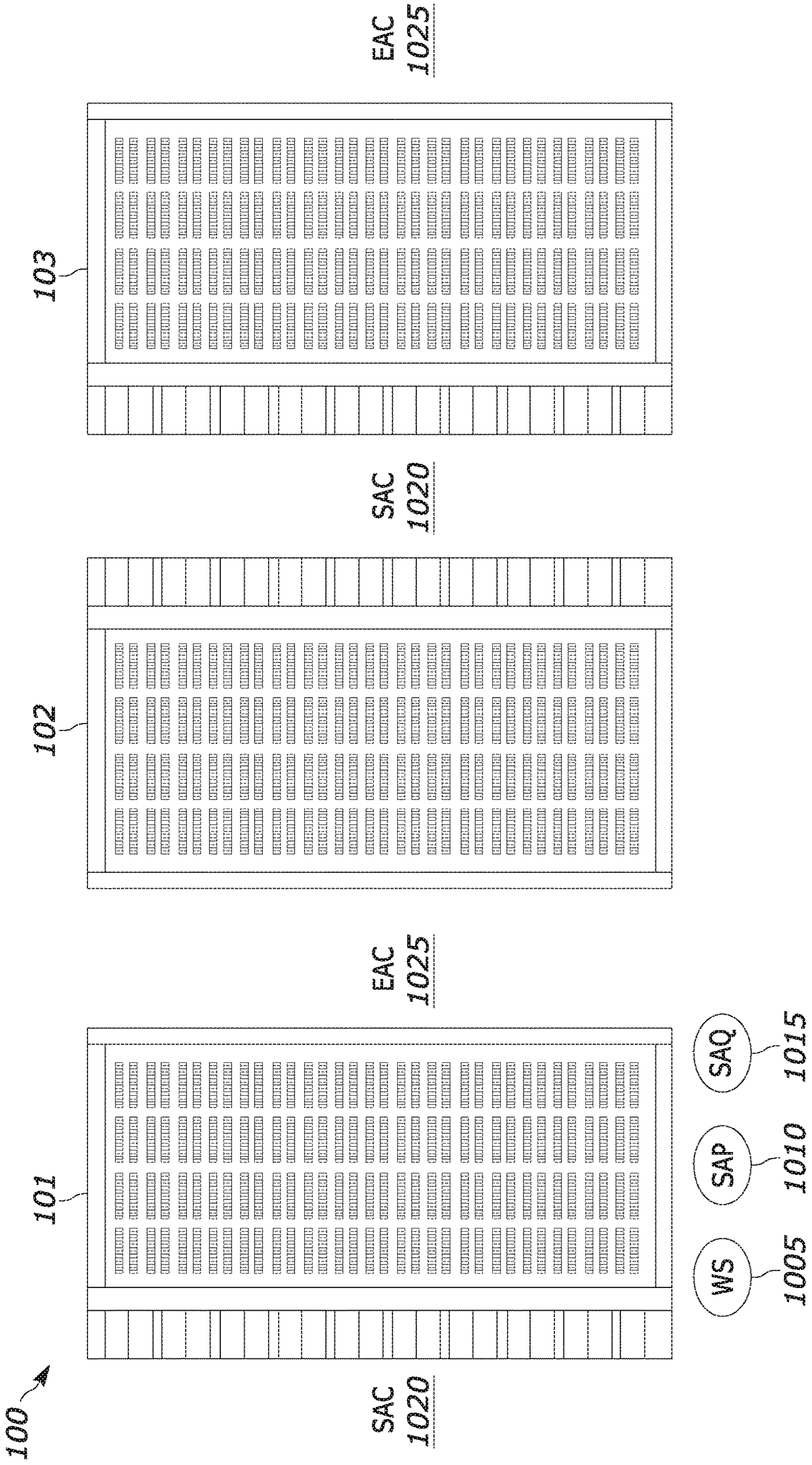
FIG. 10 illustrates the campus of FIGS. 1A and 1B with multiple example controls according to various embodiments of the present disclosure.
Figure 11:
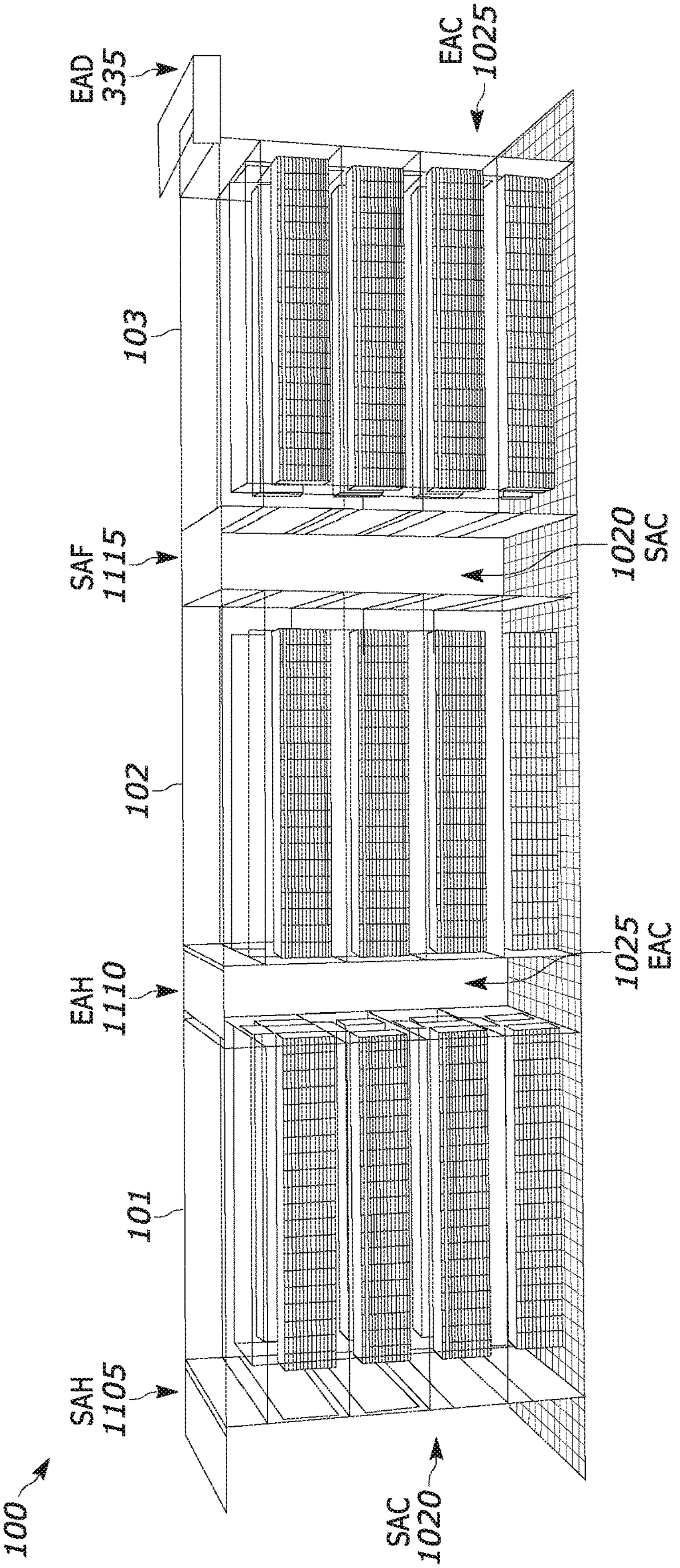
FIG. 11 illustrates additional details of example features of the campus of FIGS. 1A and 1B in an elevation view according to various embodiments of the present disclosure.

The disclosed campuses and buildings can include a variety of controls, sensors, actuators, and the like, to maintain control of the air handling and equipment cooling. FIG. 9 illustrates the mixing box 300 with multiple example controls according to various embodiments of the present disclosure. FIG. 10 illustrates the campus 100 with multiple example controls according to various embodiments of the present disclosure. FIG. 11 illustrates additional details of example features of the campus 100 in an elevation view according to various embodiments of the present disclosure.

As shown in FIG. 9, the mixing box 300 includes multiple temperature sensors 905, pressure sensors 910, and humidity sensors 915. The temperature sensors 905 can input data to the controls algorithm that is used to determine the mixing ratio, if any, needed to maintain the supply air temperature prescribed values for each data center space. The pressure sensors 910 can measure and report static pressure and differential pressure to the controls algorithm in order to determine damper positions and fan speeds. The humidity sensors 915 can input data to the controls algorithm that is used to determine the mixing ratio, if any, needed to maintain the supply air relative humidity prescribed values for each data center space.

Temperature sensors 905, pressure sensors 910, and humidity sensors 915 on the room supply side can input data to the controls algorithm to determine if prescribed values are being met. Temperature sensors 905 on the room exhaust side can input data to the controls algorithm to determine if the air will be vented to atmosphere or reused as a thermal or relative humidity conditioning element. Temperature sensors 905, pressure sensors 910, and humidity sensors 915 for air enclosures formed by the air segregation system can input data to the controls algorithm to determine serial delivery of the air stream or dump to atmosphere.

One or more air damper position sensors (not shown) can input data to the controls algorithm as a proxy for air flow through the damper(s). Temperature sensors 905, pressure sensors 910, and humidity sensors 915 associated with the mixing box can input data to the controls algorithm. A supply fan speed sensor 920 and an exhaust fan speed sensor 925 can input data to the controls algorithm as a proxy for air flow. A supply aisle anemometer (not shown) can input data to the controls algorithm as a proxy for air speed in front of the data center computing devices.

As shown in FIG. 10, the campus 100 includes a site weather station 1005, a site air particulate sensor 1010, and a site air quality sensor 1015. One or more cold supply air corridors 1020 are disposed between two adjacent buildings 101-103. One or more hot exhaust air corridors 1025 are disposed between two adjacent buildings 101-103. Each cold supply air corridor 1020 is disposed on a side of a building 101-103 opposite from a side of the building 101-103 corresponding to the hot exhaust air corridor 1025.

The site weather station 1005 can measure local weather condition information (e.g., temperature, humidity, wind speed, and the like) and provide local weather condition data for site operators to log and compare to the data center requirements. Data from the weather station 1005 can provide inputs to a controls algorithm and be used in calculations to determine ambient supply air temperature and humidity. The site air particulate sensor 1010 can sense airborne dirt and pollens, and provide data to track long term trends of airborne particles. The site air quality sensor 1015 can provide early warning of toxic chemicals or pollutants that could damage the data center computing equipment.

As shown in FIG. 11, the campus 100 can also include at least one supply air heating coil 1105, at least one exhaust air heat collection coil 1110, and at least one supply air filter frame 1115 mounted at the roof level of one or more of the buildings 101-103. The supply air heating coil 1105 includes a coil, tube, membrane, or the like deployed between the roof lines of adjacent buildings. The supply air filter frame 1115 includes a prefilter or filter deployed between the roof lines of adjacent buildings.

In some embodiments, ambient outside air having suitable temperature and relative humidity may be used directly for cooling the data center computing equipment. The ambient air can be filtered and enter the space as the supply air 205. The exhaust air 210 from the data center computing equipment can leave the building 101-103 directly to the atmosphere through a grill, louver, duct, damper, or the like connected directly to the space, room, floor, or building. This is known in the industry as "Air Side Free Cooling" and could be used in greater than 90% of the industrialized world for data center equipment cooling with ASHRAE allowable standards.

In some regions, one or more weather events could cause the ambient air to fall outside the normal air temperature and humidity ranges. Additionally or alternatively, the normal range for ambient air may not meet the facility or customer requirements 100% of the time.

When conditions are normal, the ambient supply air 205 can enter the building 101-103 through a filter bank to remove foreign material, at a prescribed filtration level, to prevent damage to the data center computing equipment. In passive designs, dampers can be at controlled openings to meet the airflow requirements of the data center computing equipment. In active designs, dampers and fans can be at a controlled openings and speeds to meet the airflow requirements of the data center computing equipment. However, when conditions are detected through one or more sensors to be outside of the design range (i.e., an excursion), a calculation can be performed by the controls algorithm to make one or more adjustments to the airflows to elicit a change in the value that was outside of the design range. Some examples of excursions and corresponding calculations will now be described.

In one example, an out-of-range air temperature is detected by the site weather station 1005. In response, the exhaust air dampers 335 may close 25% of their existing position. Heated fluid from the exhaust air heat collection coil 1110 transfers to the supply air heating coil 1105. One or more of the temperature sensors 905 (T1, T2, T3, T4) are polled by the computer algorithm for data relevant to the calculation. The controls algorithm determines a calculated position of the mixing damper 310, the exhaust air damper 335, or both. The recirculation fans 305 are commanded to operate at a determined speed to achieve the air mixing requirements to correct the air temperature back into prescribed range.

In a second example, an out-of-range entering air temperature of the supply air 205 is detected by a temperature sensor 905 of the air mixing box 300. In response, the exhaust air dampers may close 25% of their existing position. One or more of the temperature sensors 905 (T1, T2, T3, T4) are polled by the computer algorithm for data relevant to the calculation. The controls algorithm determines a calculated position of the mixing damper 310, the exhaust air damper 335, or both. The recirculation fans 305 are commanded to operate at a determined speed to achieve the air mixing requirements to correct the air temperature back into prescribed range.

In a third example, an incorrect entering air temperature of the supply air 205 is detected by a temperature sensor 905 associated with the supply air aisle 320. In response, the exhaust air dampers may close 25% of their existing position. One or more temperature sensors 905 (T1, T2, T3, T4) are polled by the computer algorithm for data relevant to the calculation. The controls algorithm determines a calculated position of the mixing damper 310, the exhaust air damper 335, or both. The recirculation fans 305 are commanded to operate at a determined speed to achieve the air mixing requirements to correct the air temperature back into prescribed range.

In a fourth example, an out-of-range humidity level is detected by the site weather station 1005. In response, the exhaust air dampers may close 25% of their existing position. Heated fluid from the exhaust air heat collection coil 1110 transfers to the supply air heating coil 1105. One or more humidity sensors 915 (RH1 and RH2) are polled for relevant data for the relative humidity calculation. One or more temperature sensors 905 (T1, T2, T3) are polled by the computer algorithm for data relevant to the calculation. The controls algorithm determines a calculated position of the mixing damper 310, the exhaust air damper 335, or both. The recirculation fans 305 are commanded to operate at a determined speed to achieve the air mixing requirements to correct the air relative humidity back into prescribed range.

In a fifth example, an out-of-range entering relative humidity level is detected by a humidity sensor 915 of the mixing box 300. In response, the exhaust air dampers close 25% of their existing position. One or more humidity sensors 915 (RH1 and RH2) are polled for relevant data for the relative humidity calculation. One or more temperature sensors 905 (T1, T2, T3) are polled by the computer algorithm for data relevant to the calculation. The controls algorithm determines calculated position of the mixing damper 310, the exhaust air damper 335, or both. The recirculation fans 305 are commanded to operate at a determined speed to achieve the air mixing requirements to correct the air relative humidity back into prescribed range.

In a sixth example, the site air particulate sensor 1010, the site air quality sensor 1015, or both, detect an out of range value indicating pollution or the like. In response, the recirculation fans 305 are commanded to operate at a minimum speed, and operations personnel are alerted.

Additional excursions and responses can include too high or too low air static pressure in the mixing box 300, the supply air aisle 320, the exhaust air aisle 315, or a combination of these. In response, fan speeds of the recirculation fans 305 can be adjusted accordingly. Of course, other excursions and responses (including other sensors and values) are possible and within the scope of this disclosure.

It is common in the data center industry to arrange racking and equipment systems in a hot and cold aisle arrangement inside a conditioned space. The arrangement of cold supply air corridors 1020 and hot exhaust air corridors 1025 in the campus 100 expands that concept to the building site or data center campus footprint. The supply air intakes of each building 101-103 face each other at a supply air corridor 1020, while the exhaust air streams from each building 101-103 face each other at an exhaust air corridor 1025. This arrangement reduces or eliminates hot air infiltration into the supply air stream. This arrangement can also create a chimney effect for the hot air expulsion to the atmosphere.

Figure 12:
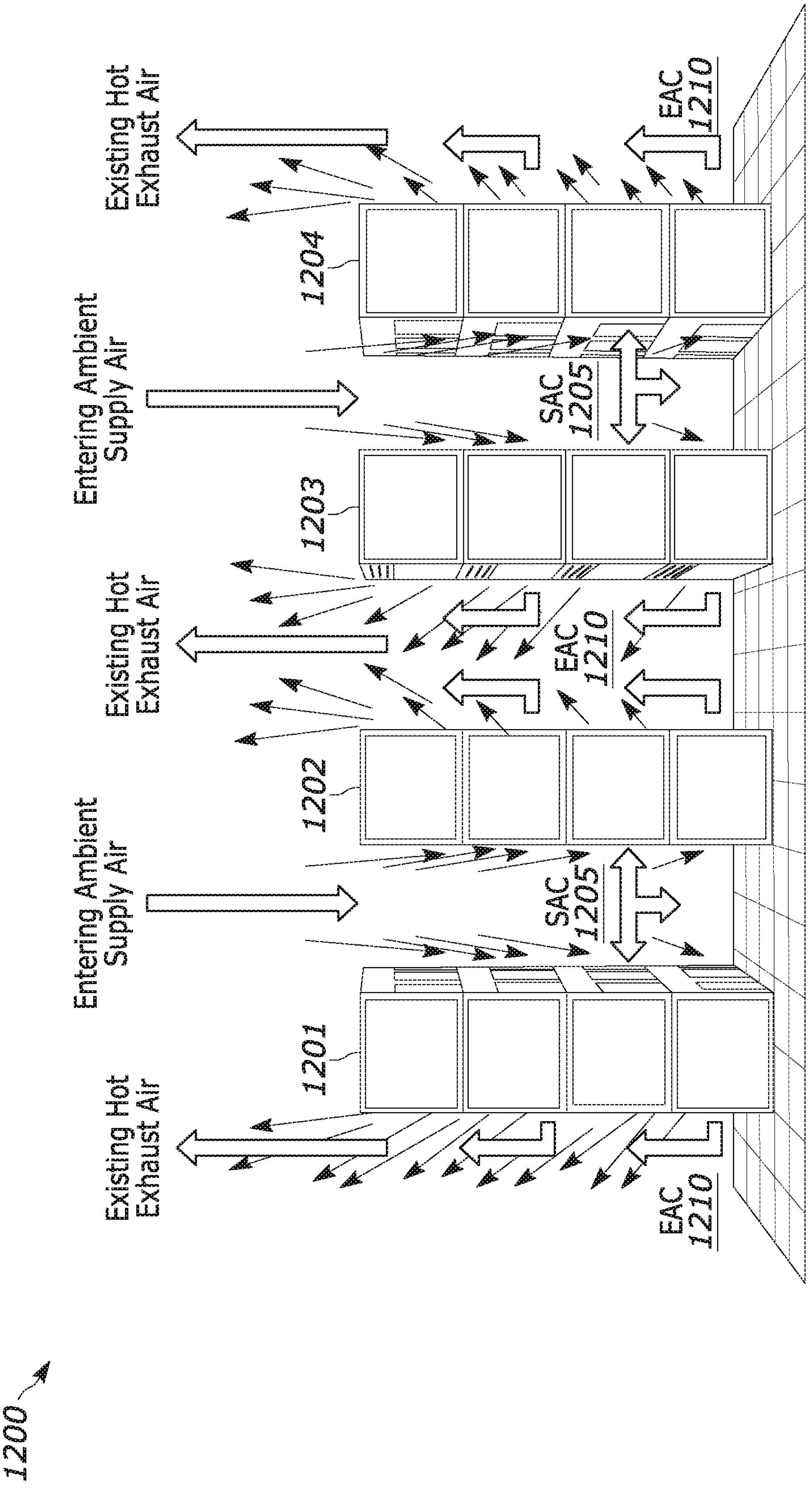
FIG. 12 illustrates another example data center campus in which cold supply air corridors and hot exhaust air corridors can be employed according to various embodiments of the present disclosure.

FIG. 12 illustrates another example data center campus 1200 in which cold supply air corridors and hot exhaust air corridors can be employed according to various embodiments of the present disclosure. In some embodiments, the campus 1200 can represent (or be represented by) the campus 100 of FIGS. 1A and 1B. The embodiment of the campus 1200 shown in FIG. 12 is for illustration only. Other embodiments of the campus 1200 could be used without departing from the scope of this disclosure.

The use of the cold supply air corridors 1205 and the hot exhaust air corridors 1210 allows the campus 1200 to be designed with reduced distances between the buildings 1201-1204 due to reduced air infiltration risk to the supply air from the exhaust air. This, in turn, allows greater efficiency of site land use by placing the buildings 1201-1204 as close to each other as building codes allow.

The concentration of heat in the exhaust air corridors 1210 may provide opportunities for heat reuse. For example, thermal energy in one or more exhaust air corridors 1210 can be directed or ducted as heated air into a conditioned space. Additionally or alternatively, thermal energy in one or more exhaust air corridors 1210 can be indirectly transferred using air to fluid transfer through heated air contact with an exhaust air heat collection coil 1110 deployed between the roof lines of adjacent buildings 1201-1204.

The cold supply air corridors 1205 may add efficiency to the air filtration system by providing a common path for entering supply air. For example, a supply air filter frame 1115 deployed between adjacent buildings 1201-1204 can be fitted with a prefilter or filter to clean the air as it enters the cold supply air corridor 1205. Each supply air filter frame 1115 can be installed from the roof lines or any point down to grade of adjacent buildings 1201-1204.

In some climates where the supply air may require a higher temperature for data center use, an array of coils, tubes, or membranes placed in the air stream in the exhaust air corridors 1210 can collect thermal energy from the exhaust air through an air to liquid transfer. This thermal energy may then be used to prewarm the supply air through a series of heating coils placed in the adjacent supply air corridors 1205 at the building roof lines or any point down to grade.

Figure 13:
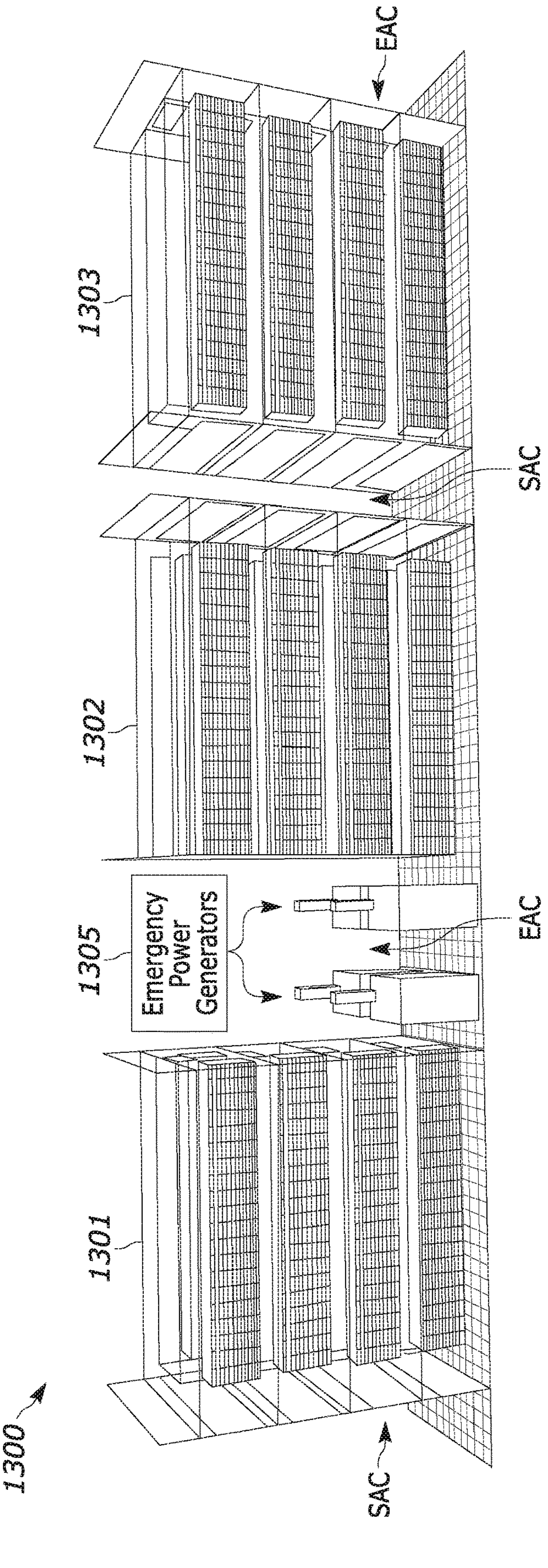
FIG. 13 illustrates an example campus that includes one or more emergency power generators, according to various embodiments of the present disclosure.

In some site layouts, one or more engine driven emergency generators can be placed in the hot corridor to promote dilution of exhaust from the generator(s). For example, FIG. 13 illustrates an example campus 1300 with multiple buildings 1301-1303. As shown in FIG. 13, the campus 1300 includes one or more emergency power generators 1305 disposed in the exhaust air corridor between the buildings 1301-1302. The exhaust air corridor can aid in the dilution and convective transfer of the exhaust from the generators 1305 to greater elevation into the atmosphere when in use. This may bring any toxic or polluting air above and beyond the infiltration of the supply air corridor.

Figure 14:
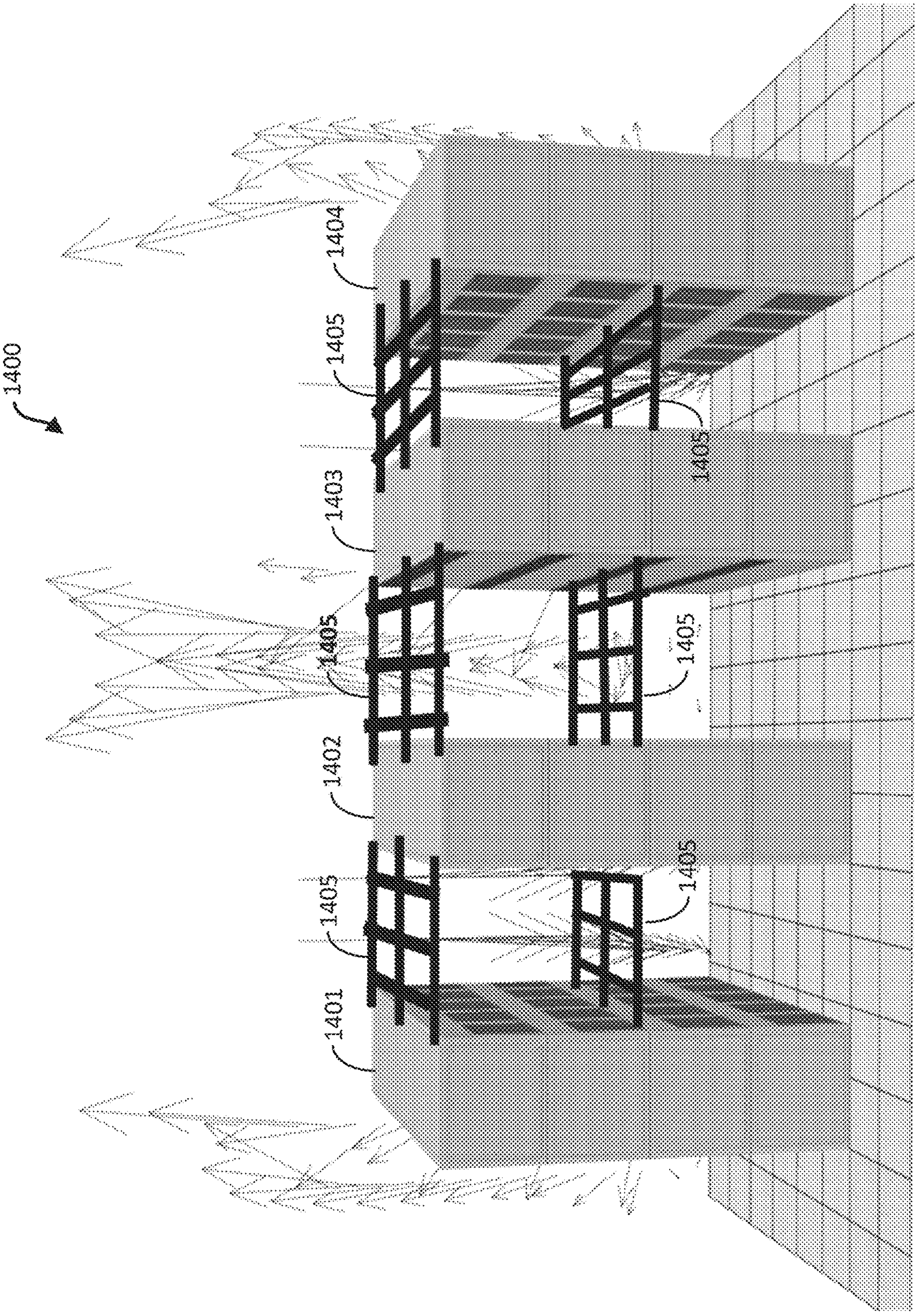
FIG. 14 illustrates an example campus that includes a supportive grid between buildings according to various embodiments of the present disclosure.

FIG. 14 illustrates an example campus 1400 that includes a supportive grid between buildings according to various embodiments of the present disclosure. In some embodiments, the campus 1400 can represent (or be represented by) the campus 100 of FIGS. 1A and 1B. The embodiment of the campus 1400 shown in FIG. 14 is for illustration only. Other embodiments of the campus 1400 could be used without departing from the scope of this disclosure.

As shown in FIG. 14, the campus 1400 include multiple buildings 1401-1404. The campus also includes one or more engineered framing systems or grids 1405 that are installed on or near at least one of the buildings 1401-1404. In some embodiments, at least one grid 1405 can be mounted between adjacent buildings 1401-1404. In some embodiments, at least one grid 1405 can be cantilevered from a single building 1401-1404. In some embodiments, at least one grid 1405 can be supported from grade, hung from above, or supported from any other structure appropriate for intended use at any suitable elevation.

Each grid 1405 may be used to support some of the features described in this disclosure, including, but not limited to: air to liquid heat or cooling collection coils or systems; liquid to air heating or cooling coils or systems; ducted supply or exhaust air for reuse in the same space or buildings, or in another space or buildings not associated with the site; heat collection or rejection for district heating or cooling; wind turbine mounting for any perspective, including horizonal, vertical, angled, hung, tethered, and the like; power generator exhaust or supply air or combustion air ducts or pipes; or power or cooling paths and mounting for conduit cables pipes or tubing.

Figure 15:
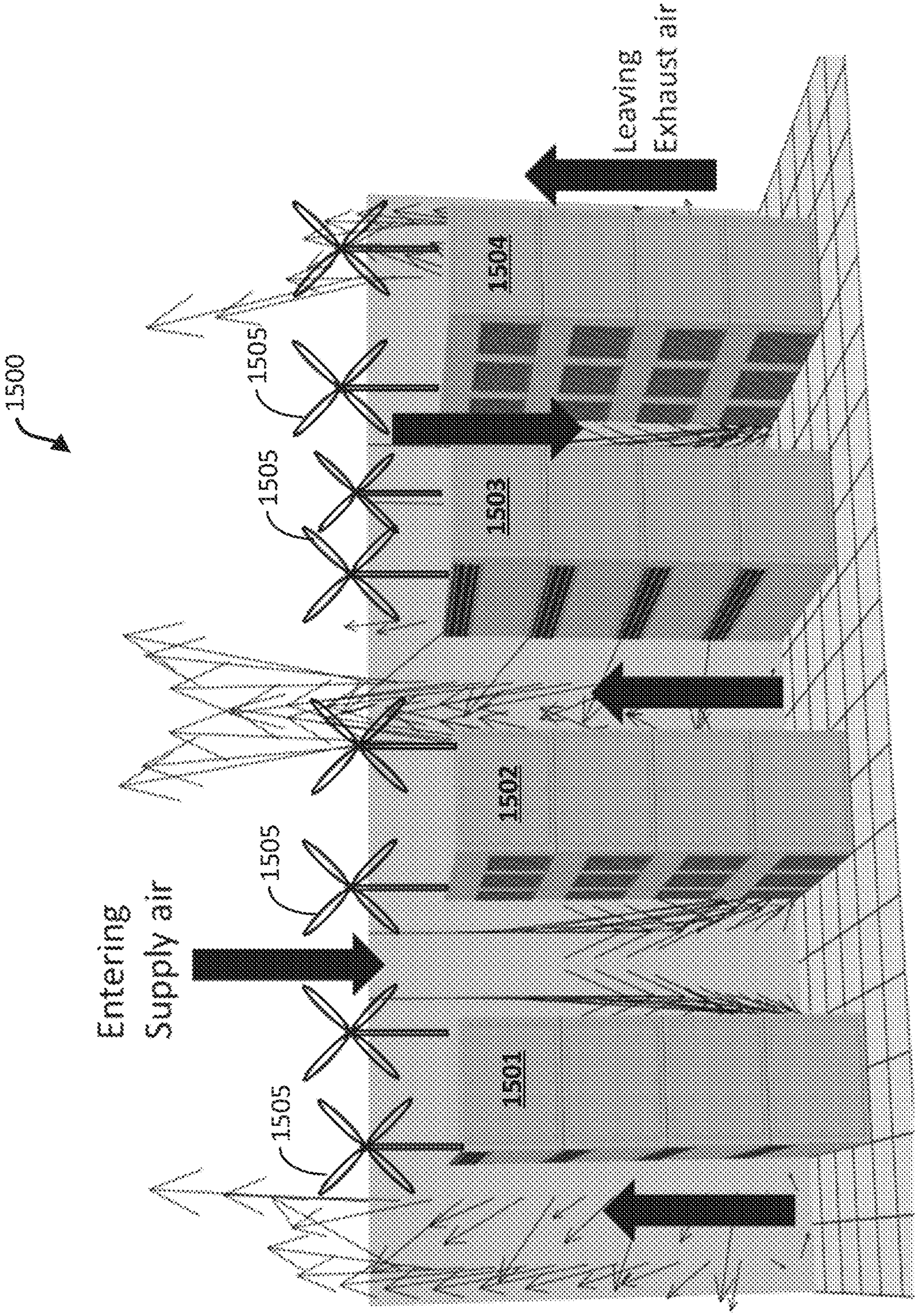
FIG. 15 illustrates an example campus that is capable of generating power from air currents according to various embodiments of the present disclosure.

FIG. 15 illustrates an example campus 1500 that is capable of generating power from air currents according to various embodiments of the present disclosure. In some embodiments, the campus 1500 can represent (or be represented by) the campus 100 of FIGS. 1A and 1B. The embodiment of the campus 1500 shown in FIG. 15 is for illustration only. Other embodiments of the campus 1500 could be used without departing from the scope of this disclosure.

As shown in FIG. 15, the campus 1500 include multiple buildings 1501-1504. One or more wind turbines 1505 are deployed at or near the top of one or more of the buildings 1501-1504. In some embodiments, the wind turbines 1505 are deployed along a roof edge. The wind turbines 1505 are provided to generate power from the supply air streams and exhaust air streams created by the data center building and air venting topology.

As described in conjunction with other campus embodiments, the buildings 1501-1504 are constructed to be in close proximity to each other. The building layout results in narrow supply air corridors and exhaust air corridors between the buildings 1501-1504 that can produce a high-volume (e.g., 3000 cfm), high velocity air flow capable of rotating the wind turbines 1505. The wind turbines 1505 can be configured in many form factors, including but not limited to, multi-blade windmills, single blade windmills, drums, vertical mount, horizonal mount, cabled, balloon, and the like. In some embodiments, the wind turbines 1505 can be mounted between the building structures in layers as multiple columns or multiple rows. The energy created by the wind turbines 1505 can be used directly by the data center facility, stored in batteries for future use, or provided to a local electrical grid.

The wind turbines 1505 may be mounted at any elevation and/or location within the supply air stream or exhaust air stream. The air stream can include any air currents created by the building topology or the air corridor topology that can be identified in a Computational Fluid Design (CFD) modeling of the site and building layouts.

The use of data center campuses with building layouts arranged as discussed herein can have a significant impact on the efficiency of data center cooling and airflow management. In particular, these arrangements and layouts and the use of the hot and cold building corridor topology can reduce or eliminate unintended consequences of poor planning and design.

Figure 16:
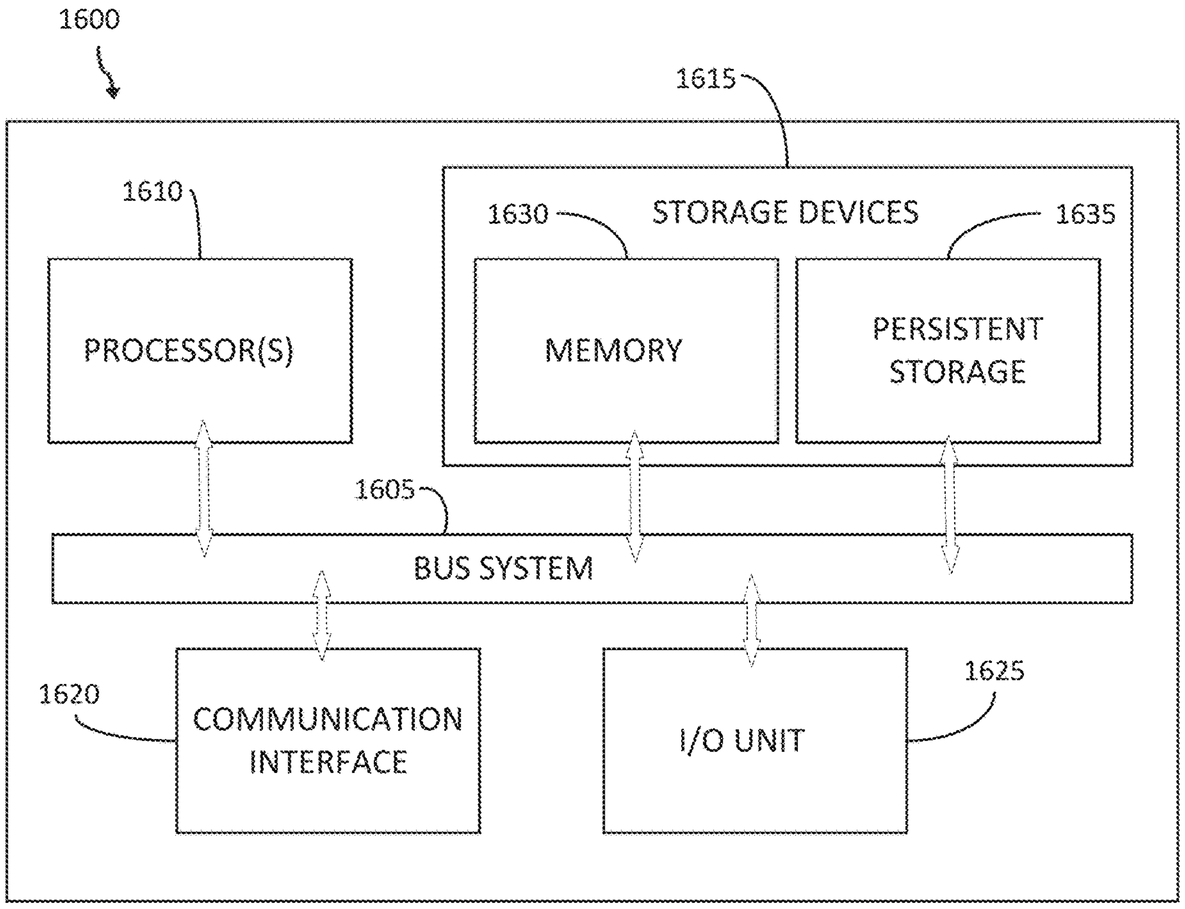
FIG. 16 illustrates an example of a computing device for use in a data center cooling system according to various embodiments of the present disclosure.

FIG. 16 illustrates an example of a computing device 1600 for use in a data center cooling system according to various embodiments of the present disclosure. The computing device 1600 can be configured to control any of the operations discussed herein, including control of operation of any of the disclosed sensors, actuators, and the like, and performance of any disclosed algorithms.

As shown in FIG. 16, the computing device 1600 includes a bus system 1605, which supports communication between processor(s) 1610, storage devices 1615, communication interface (or circuit) 1620, and input/output (I/O) unit 1625. The processor(s) 1610 executes instructions that may be loaded into a memory 1630. The processor(s) 1610 may include any suitable number(s) and type(s) of processors or other devices in any suitable arrangement. Example types of processor(s) 1610 include microprocessors, microcontrollers, digital signal processors, field programmable gate arrays, application specific integrated circuits, and discrete circuitry.

The memory 1630 and a persistent storage 1635 are examples of storage devices 1615, which represent any structure(s) capable of storing and facilitating retrieval of information (such as data, program code, and/or other suitable information on a temporary or permanent basis). The memory 1630 may represent a random access memory or any other suitable volatile or non-volatile storage device(s). The persistent storage 1635 may contain one or more components or devices supporting longer-term storage of data, such as a read-only memory, hard drive, Flash memory, or optical disc. For example, persistent storage 1635 may store one or more databases of data, standards data, results, data, client applications, etc.

The communication interface 1620 supports communications with other systems or devices. For example, the communication interface 1620 could include a network interface card or a wireless transceiver facilitating communications over any of the disclosed campuses, including the campus 100. The communication interface 1620 may support communications through any suitable physical or wireless communication link(s). The I/O unit 1625 allows for input and output of data. For example, the I/O unit 1625 may provide a connection for user input through a keyboard, mouse, keypad, touchscreen, or other suitable input devices. The I/O unit 1625 may also send output to a display, printer, or other suitable output devices.

Although FIG. 16 illustrates one example of a computing device 1600, various changes may be made to FIG. 16. For example, various components in FIG. 16 could be combined, further subdivided, or omitted and additional components could be added according to particular needs. As a particular example, while depicted as one system, the computing device 1600 may include multiple computing systems that may be remotely located. In another example, the computing device 1600 may be a personal electronic device, such as, a phone, tablet, or laptop, or provide or update a user interface, e.g., via a software application, or other communications interface to a personal electronic device for control, management, information, and or access to the computing device 1600 and/or any aspects of the systems disclosed herein.

As discussed above, high-density data centers (such as those used for cryptocurrency mining, sometimes referred to as "bit mines") generate a significant amount of heat during ordinary operational activity. In most air-cooled data center designs, this generated heat is rejected to the ambient atmosphere.

The air cooling of densely packed computing equipment requires large masses of supply air flowing into the devices. For example, a high-density data center space that is thirty feet long and twenty feet in elevation may require 300,000 cubic feet per minute (CFM) of air volume or more to meet the cooling requirements of the computing equipment.

Many bit mines and high-density data centers are characterized by the following attributes. Generally, the data centers include one or more long, narrow buildings that are as narrow as five feet wide and have lengths that may range from thirty feet to over two thousand feet or more (although other widths and lengths are possible). Each building may have any roofline including, but not limited to, center line ridge, flat, sloped at different angles, gabled, "A" frame, butterfly, hip, shed, or the like.

When there is more than one building, the buildings are generally placed very close to each other to conserve space. Layouts of the multiple buildings can include, but are not limited to, buildings parallel to each other, buildings in a square or rectangular layout, multiple cold ambient supply air corridors facing each other, multiple hot air corridors facing each other, circular, star shape, hub and spoke layout, and the like.

When multiple buildings share a supply air corridor, the distance between the buildings can be dependent on the volume of air required and the size of buildings. In some implementations, the desired or required ambient supply air opening may result in a spacing of 30-100 feet between buildings, while the optimum exhaust air distance may be in a range of 5-15 feet. Of course, other dimensions are possible and within the scope of this disclosure.

As discussed in FIG. 12 above, ambient cool supply air enters one side of building 1201-1204 via one or more cold supply air corridors 1205. The ambient cool air is processed through the computing equipment, which results in the air being heated through an air-to-air thermal transfer inside the computing equipment. The air is then rejected to the ambient atmosphere out the opposite side of the building 1201-1204 into one or more hot exhaust air corridors 1210.

Figure 17A:
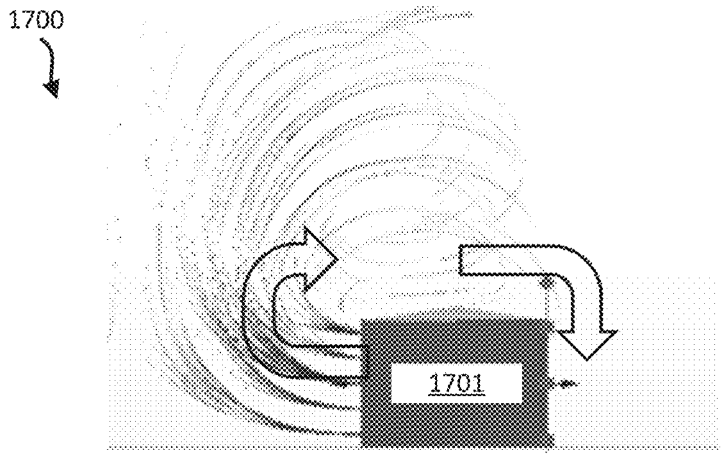
FIGS. 17A and 17B illustrate examples of an exhausted hot air stream mixing with an ambient cool air stream.
Figure 17B:
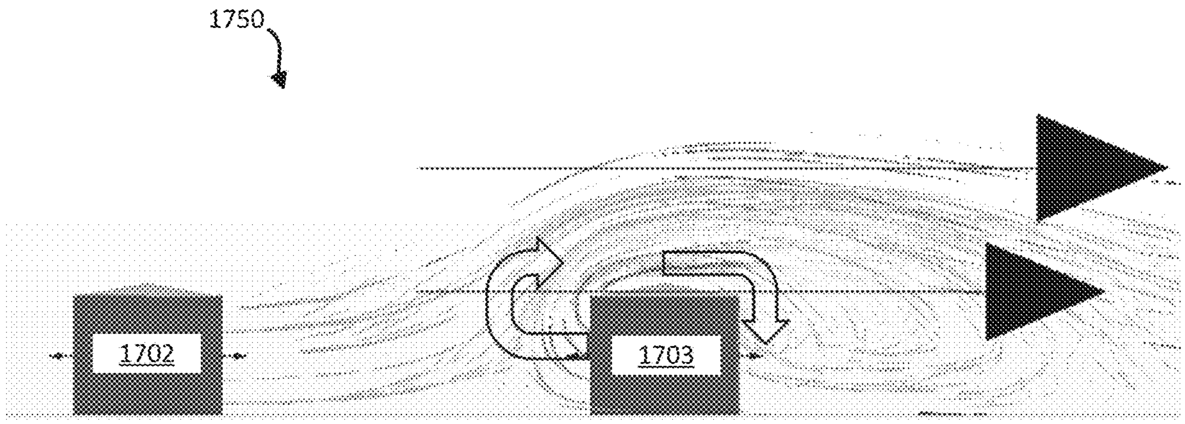

Due to the proximity of the ambient supply air opening and the rejected heated air opening and the fluidity of air, the exhausted hot air stream will sometimes mix with the ambient cool air stream. FIGS. 17A and 17B illustrate examples of this effect. FIG. 17A illustrates a data center campus 1700 with a single building 1701 in which ambient supply air enters on one side, and hot exhaust air exits on an opposite side. As indicated by the air flow lines, the hot exhaust air is entrained directly into the cooler ambient air path, and the two become a single or combined air stream. FIG. 17B illustrates a data center campus 1750 with two buildings 1702-1703 disposed side by side and sharing a common hot exhaust air corridor between the buildings 1702-1703. Hot exhaust air from both buildings 1702-1703 is entrained into the cooler ambient air path above the building 1703, causing thermal dilution of the cooler air (i.e., causing the ambient supply air to be at a higher temperature).

The elevated supply air temperature caused by the air entrainment and dilution impacts the fan energy used by the engineered cooling solution of each data center campus 1700 and 1750. For example, higher temperature supply air requires more volume to reject the heat through the air-to-air thermal transfer inside the computing equipment. Similarly, the fan energy used by the computing equipment may be increased due to the higher supply air temperatures from the entrained or diluted rejected heated air. Under elevated supply air temperatures, the computing equipment itself will operate at a lower production output. This reduces the economic value to the operator or customer.

To address these and other issues, various embodiments of this disclosure can include one or more air diverter structures that prevent or mitigate the heated exhaust air from entraining or diluting the cool supply air stream.

Figure 18:
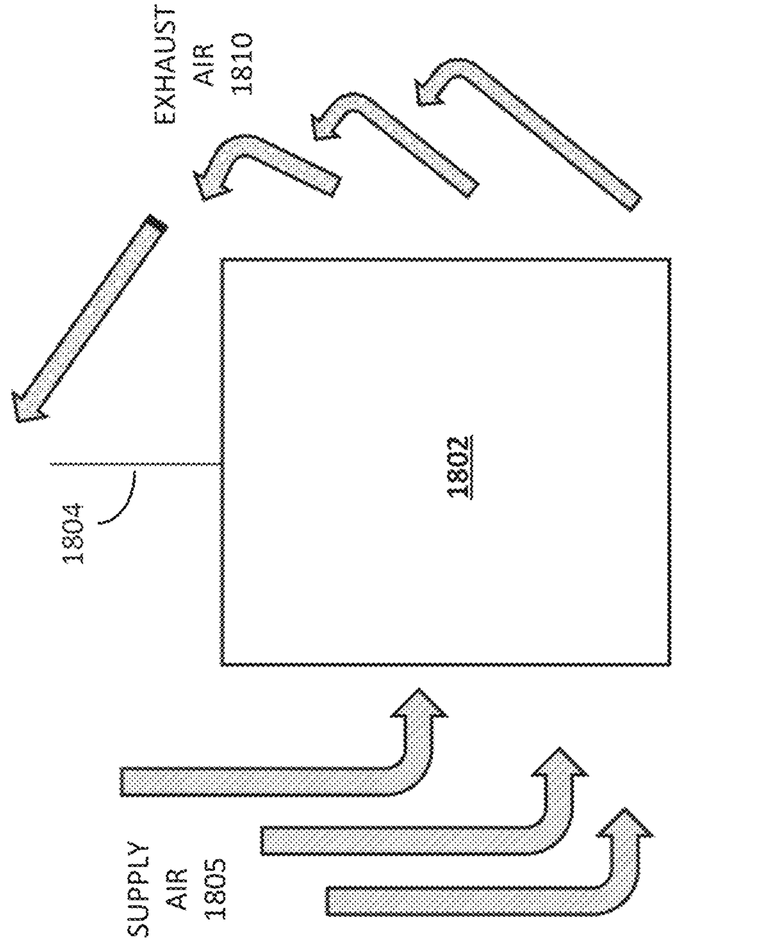
FIG. 18 illustrates an example data center building that includes an air diverter structure according to this disclosure.

FIG. 18 illustrates an example data center building 1802 that includes an air diverter structure according to this disclosure. The embodiment of the data center building 1802 shown in FIG. 18 is for illustration only. Other embodiments of the data center building 1802 could be used without departing from the scope of this disclosure.

As shown in FIG. 18, the data center building 1802 is part of a data center campus, such as the campus 100 of FIGS. 1A and 1B. In some embodiments, the data center building 1802 can represent (or be represented by) the buildings 101-103 of FIGS. 1A and 1B. A cool supply air stream 1805 enters the building 1802 on one side, is used or reused for cooling computing equipment, such as described above, and is then exhausted from an opposite side of the building 1802 as heated exhaust air 1810.

A diverter structure 1804 is disposed atop the exterior of the building 1802. The diverter structure 1804 is provided to push the heated exhaust air 1810 past and/or above the cold air flow boundary, where the influence of the cold downward air stream 1805 is neutral to positive pressure. Stated differently, the diverter structure 1804 diverts the heated exhaust air 1810 away from the cool supply air stream 1805 to a point in the atmosphere where the entrainment and/or dilution of the heated exhaust air 1810 into the cool supply air stream 1805 is eliminated or mitigated. In some embodiments, the entrainment and/or dilution of the heated exhaust air 1810 is eliminated or mitigated to a level that does not significantly impact the thermal rise in the cool supply air stream 1805. In some embodiments, the entrainment and/or dilution of the heated exhaust air 1810 is eliminated or mitigated to a level that does not increase the energy requirements of the operators in the building 1802. In some embodiments, the entrainment and/or dilution of the heated exhaust air 1810 is eliminated or mitigated to a level that does not reduce the performance and economic benefits of the computing equipment designed output.

In some embodiments, the diverter structure 1804 comprises a single narrow blade of material attached along the length of the building 1802 at any point on the roof structure between the supply air side opening and the exhaust air side opening. The diverter structure 1804 may be constructed of any material suitable for the application, such as metal, masonry, wood, plastic or composite, or a combination of these. In some embodiments, the diverter structure 1804 can include one or more flexible materials stretched between support structures, including cables, ropes, poles, framing, or the like. The diverter structure 1804 may have any suitable length. In some embodiments, the elevation of the diverter structure 1804 is a prescribed value (e.g., between 1 and 20 feet) that is determined by site conditions, environmental conditions, and the like. The diverter structure 1804 may be attached to any roofing structure as an additional component. The diverter structure 1804 may be added to the building 1802 or a structure connected to the building 1802 as an engineered element or a retrofit element. As shown in FIG. 18, the diverter structure 1804 may be perpendicular to grade, as viewed from the end profile of the building 1802. Of course, this is merely one example. In other embodiments, the diverter structure 1804 may be angled at any angle between 0 and 180 degrees when viewed from the end profile of the building 1802.

In some embodiments, the diverter structure 1804 may be fixed in a set position and orientation. In some embodiments, the diverter structure 1804 may be fixed at an angle. For example, the diverter structure 1804 may be fixed at an angle greater or less than 90 degrees from the long edge or eave line of the building 1802. In other embodiments, the diverter structure 1804 can be moveable, in location, position, or both. For example, the diverter structure 1804 may be moveable (either manually or via motorized operation) between 0 and 180 degrees when viewed from the end profile of the building 1802. In some embodiments, the diverter structure 1804 may be retractable or extended to different elevations.

As shown in FIG. 18, the diverter structure 1804 may be attached to the roof of the building 1802. Additionally or alternatively, the diverter structure 1804 may be attached to one or more walls of the building 1802. In some embodiments, the diverter structure 1804 may extend from the building 1802 to another adjacent building (not shown in FIG. 18). Additionally or alternatively, the diverter structure 1804 may be attached to the walls or roof of one or more adjacent buildings. Additionally or alternatively, the diverter structure 1804 may be attached to a pole or other structure next to the long walls of the building 1802.

Figure 19:
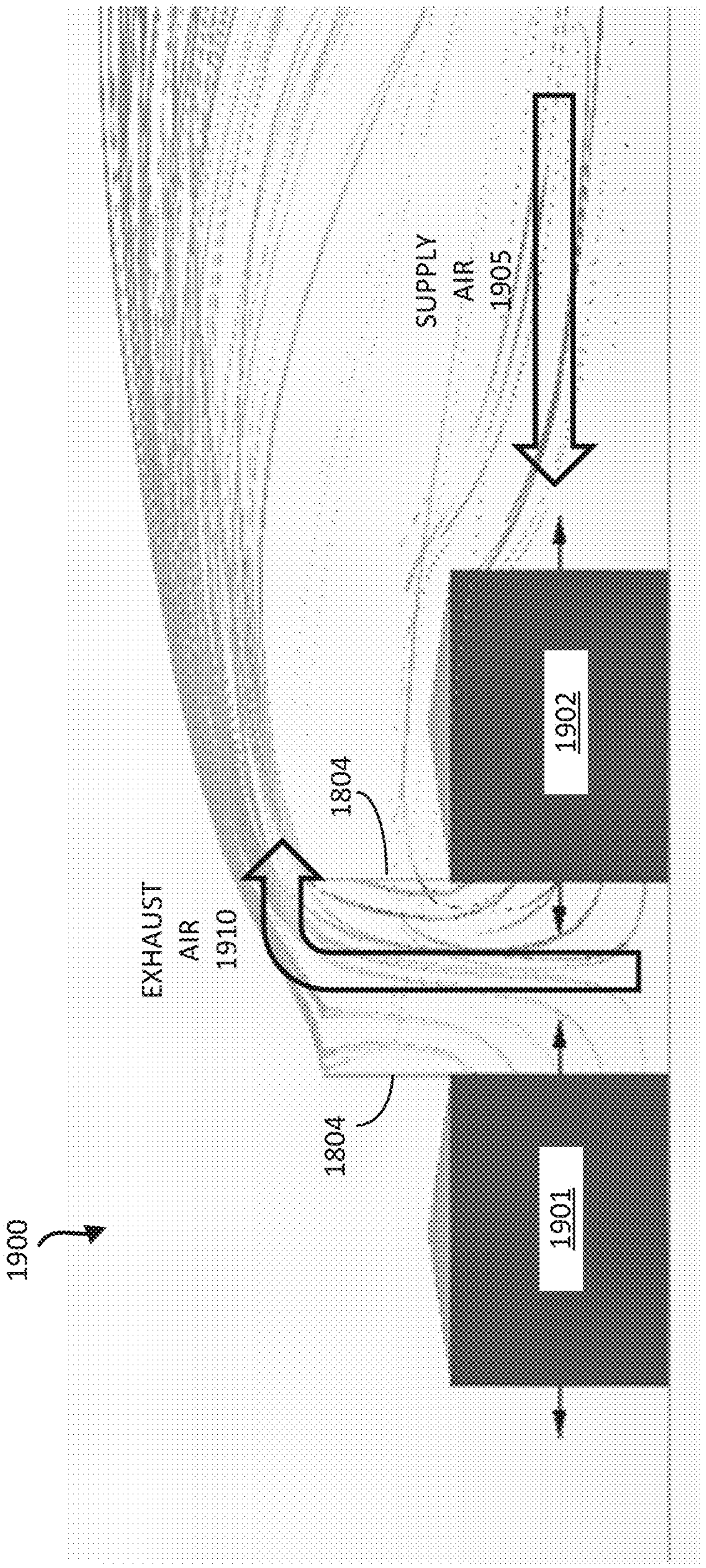
FIG. 19 illustrates an example data center campus in which multiple air diverter structures are used according to this disclosure.

FIG. 19 illustrates an example data center campus 1900 in which multiple air diverter structures are used according to this disclosure. In some embodiments, the campus 1900 can represent (or be represented by) the campus 100 of FIGS. 1A and 1B. The embodiment of the data center campus 1900 shown in FIG. 19 is for illustration only. Other embodiments of the data center campus 1900 could be used without departing from the scope of this disclosure.

As shown in FIG. 19, the campus 1900 includes multiple buildings 1901-1902 arranged in close proximity to each other. Each building 1901-1902 includes a diverter structure 1804 attached to the roof. Together, the diverter structures 1804 divert the heated exhaust air 1910 above the boundary interface and away from the cool supply air stream 1905 to a point in the atmosphere where the entrainment and/or dilution of the heated exhaust air 1910 into the cool supply air stream 1905 is eliminated or mitigated. That is, the cool supply air stream 1905 enters the building 1902 without significant hot air entrainment or hot air dilution of the cool supply air stream 1905.

Figure 20:
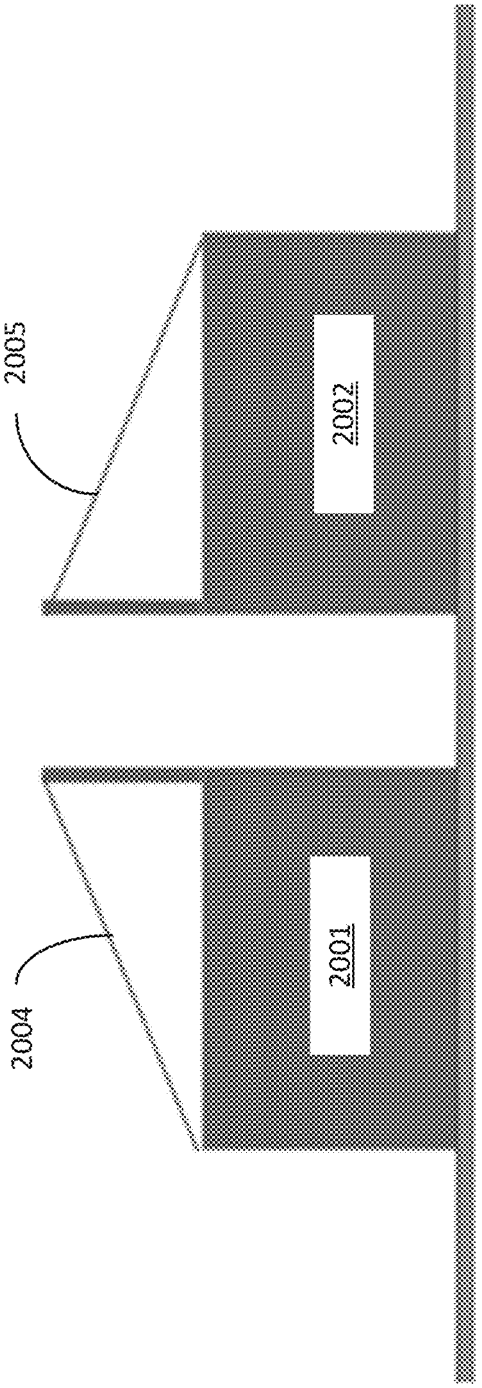
FIGS. 20 and 21 illustrate examples of other diverter structures according to various embodiments of the present disclosure.
Figure 21:
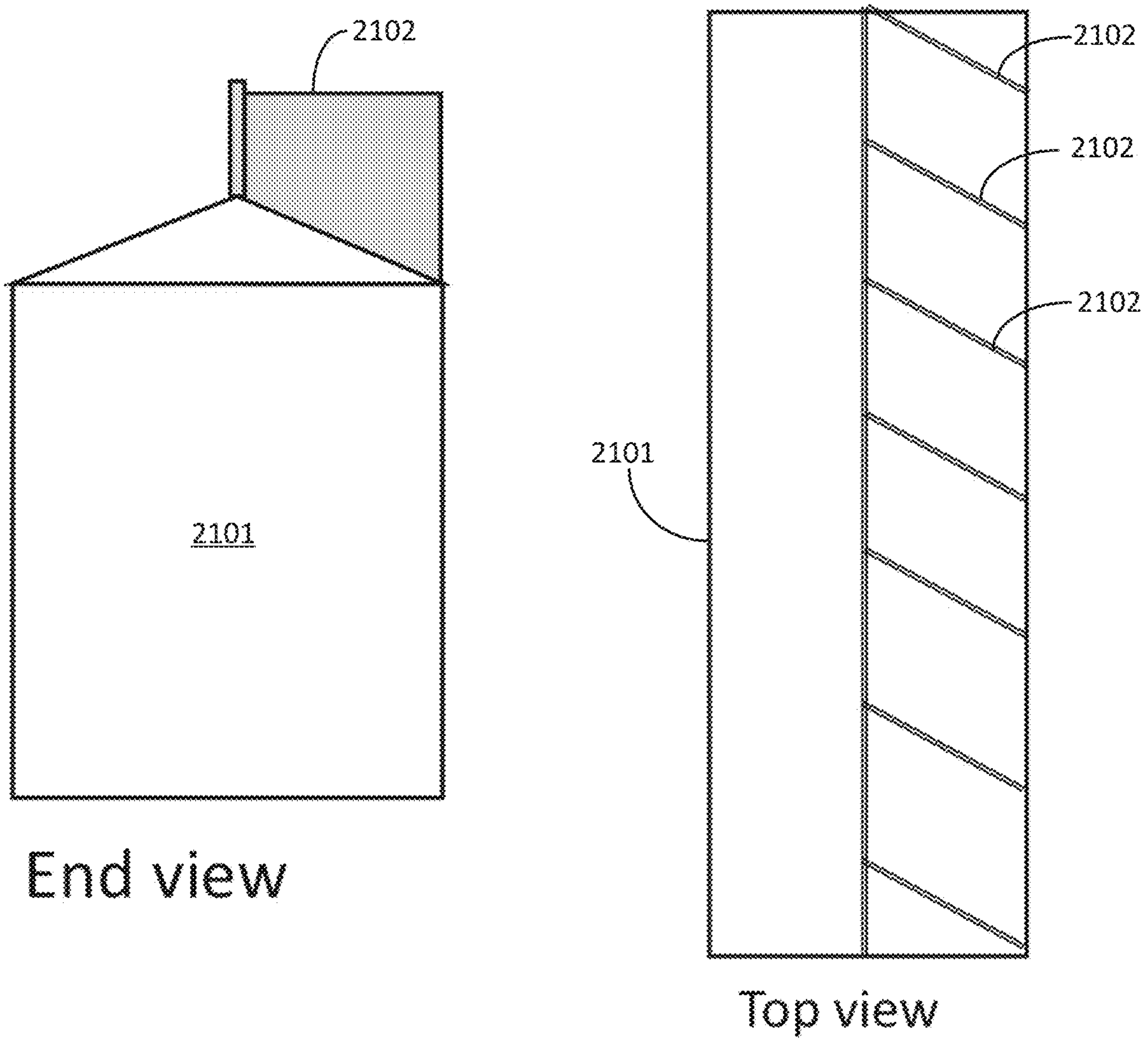

FIGS. 20 and 21 illustrate examples of other diverter structures according to various embodiments of the present disclosure. As shown in FIG. 20, multiple buildings 2001-2002 each include a diverter structure 2004-2005 attached to the roof. In FIG. 20, the diverter structures 2004-2005 have a triangular overall shape. The triangular shapes of the diverter structures 2004-2005 are oriented in different directions. In some embodiments, the diverter structures 2004-

2005 may include integrated roofing elements that are formed in the desired shape and installed in the desired orientation.

As shown in FIG. 21, a building 2101 (shown in both end view and top view) includes multiple diverter structures 2102 arranged in parallel along one roof section. Each diverter structure 2102 has an overall trapezoidal shape. As shown in the top view of FIG. 21, the diverter structures 2102 are oriented at an angle to the center ridge line of the roof.

Although FIGS. 18 through 21 illustrates different examples of diverter structures and related details, various changes may be made to FIGS. 18 through 21. For example, various components shown in FIGS. 18 through 21 may be combined, further subdivided, replicated, rearranged, or omitted and additional components may be added according to particular needs.

Figure 22:
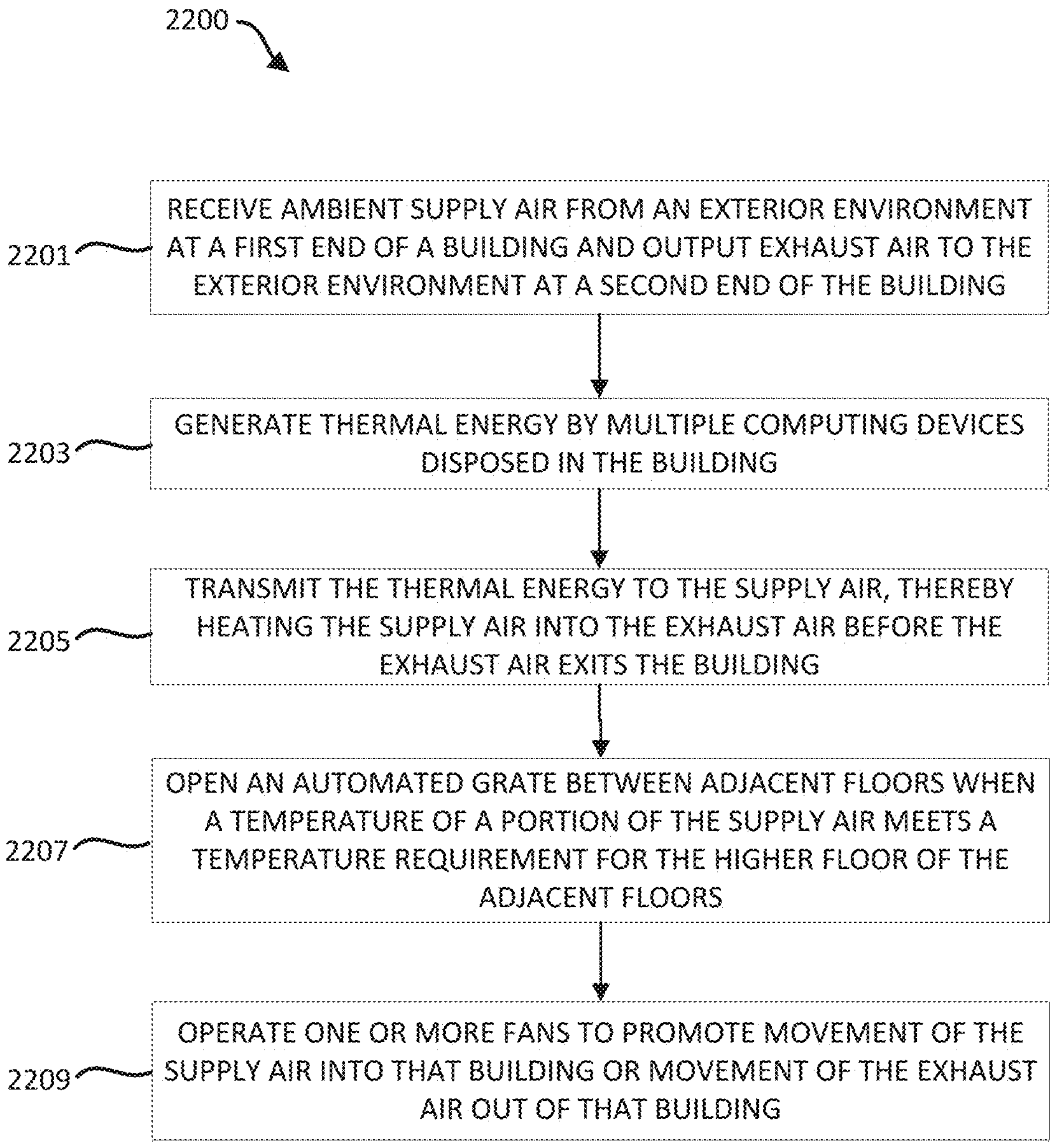
FIG. 22 illustrates an example method 2200 for improved air cooling of equipment in data center campuses according to various embodiments of the present disclosure.

FIG. 22 illustrates an example method 2200 for improved air cooling of equipment in data center campuses according to various embodiments of the present disclosure. For ease of explanation, the method 2200 is described as being performed using various components, devices, and systems described in FIGS. 1 through 21. However, the method 2200 may be used with any other suitable component, device, and system. The embodiment shown in FIG. 22 is for illustration only. Other embodiments of the method 2200 could be used without departing from the scope of this disclosure.

At operation 2201, ambient supply air from an exterior environment is received at a first end of a building and exhaust air is output to the exterior environment at a second end of the building. The building can be a first building or a second building among multiple buildings disposed in close proximity to each other. The first end of the first building and the first end of the second building form portions of a supply air corridor between the first building and the second building.

At operation 2203, thermal energy is generated by multiple computing devices disposed in the building.

At operation 2205, the thermal energy is transmitted to the supply air, thereby heating the supply air into the exhaust air before the exhaust air exits the building.

At operation 2207, an automated grate is opened between adjacent floors when a temperature of a portion of the supply air meets a temperature requirement for the higher floor of the adjacent floors.

At operation 2209, one or more fans are operated to promote movement of the supply air into that building or movement of the exhaust air out of that building.

Although FIG. 22 illustrates one example of a method 2200 for improved air cooling of equipment in data center campuses, various changes may be made to FIG. 22. For example, while shown as a specific sequence of operations, various operations shown in FIG. 22 could overlap, occur in parallel, occur in a different order, or occur any number of times. Also, the specific operations shown in FIG. 22 are examples only, and other techniques could be used to perform each of the operations shown in FIG. 22.

It is noted that various figures and portions of the specification list example values or ranges of values (e.g., temperatures or temperature ranges). These are provided by way of example only and any suitable alternative value or value range may be used in embodiments of the present disclosure.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "such as," when used among terms, means that the latter recited term(s) is(are) example(s) and not limitation(s) of the earlier recited term. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer-readable medium. The terms "application" and "program" refer to one or more computer programs, software components, sets of instructions, procedures, functions, objects, classes, instances, related data, or a portion thereof adapted for implementation in a suitable computer readable program code. The phrase "computer-readable program code" includes any type of computer code, including source code, object code, and executable code. The phrase "computer-readable medium" includes any type of medium capable of being accessed by a computer, such as read-only memory (ROM), random access memory (RAM), a hard disk drive, a compact disc (CD), a digital video disc (DVD), or any other type of memory. A "non-transitory" computer-readable medium excludes wired, wireless, optical, or other communication links that transport transitory electrical or other signals. A non-transitory, computer-readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases. Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claim scope. The scope of the patented subject matter is defined by the claims.

What is claimed is:

1. A system comprising:

multiple buildings including a first building and a second building disposed in close proximity to each other, each of the buildings having a first end configured to receive ambient supply air from an exterior environment and a second end configured to output exhaust air to the exterior environment, each of the buildings being a multi-floor building containing multiple computing devices, wherein the computing devices in each building are configured to generate thermal energy that is transmitted to the supply air, thereby heating the supply air into the exhaust air before the exhaust air exits that building, wherein the first end of the first building is a closest end to the second building and the first end of the second building is a closest end to the first building, wherein the first end of the first building and the first end of the second building form portions of a supply air corridor between the first building and the second building, wherein each floor contains at least some of the multiple computing devices arranged in racks having a supply air side and an exhaust air side, the supply air side and the exhaust air side alternating between adjacent floors, and wherein at least one of the buildings comprises at least one grate disposed between the adjacent floors and configured to allow a portion of the supply air to flow from the exhaust air side of a lower floor to the supply air side of a higher floor that is adjacent to the lower floor when a temperature of the portion of the supply air meets a temperature requirement for the higher floor.

2. The system of claim 1, wherein, for each building:

the first end of the building comprises a first damper or vent disposed on an exterior wall of a first floor, the first damper or vent configured to allow the supply air to enter the building, the second end of the building comprises a second damper or vent disposed on an exterior wall of another floor, the second damper or vent configured to allow the exhaust air to exit the building, and the other floor is higher than the first floor.

3. The system of claim 1, wherein the at least one grate is configured to automatically open when the temperature requirement is met.

4. The system of claim 1, wherein each building comprises one or more fans configured to promote movement of the supply air into that building or movement of the exhaust air out of that building.

5. The system of claim 1, wherein at least one of the buildings comprises a mixing box configured to provide controlled mixing of the supply air with a portion of the exhaust air, so as to change at least one of a temperature or a relative humidity of the supply air before the supply air enters that building.

6. The system of claim 1, wherein at least one of the multiple buildings comprises an air diverter structure disposed atop an exterior of the at least one building, the air diverter structure configured to reduce mixing of the supply air and the exhaust air on the exterior of the at least one building.

7. The system of claim 1, further comprising:

a frame installed at or near a roof level between the first building and the second building and mounted to at least one of the first building or the second building, the frame configured to support one or more devices that operate in conjunction with a flow of the ambient supply air between the first building and the second building.

8. The system of claim 7, wherein the one or more devices comprise at least one of a supply air heating coil, an exhaust air heat collection coil, a supply air filter, or a power generator.

9. The system of claim 1, wherein the second end of the first building and an end of an adjacent third building form portions of an exhaust air corridor between the first building and the third building.

10. The system of claim 9, further comprising:

at least one power generator disposed in the exhaust air corridor between the first building and the third building.

11. The system of claim 9, further comprising:

at least one wind turbine disposed in at least one of the supply air corridor or the exhaust air corridor.

12. A method comprising:

at each of multiple buildings including a first building and a second building disposed in close proximity to each other:

receiving ambient supply air from an exterior environment at a first end and outputting exhaust air to the exterior environment at a second end, each of the buildings being a multi-floor building containing multiple computing devices;

generating thermal energy by multiple computing devices disposed in that building; and transmitting the thermal energy to the supply air, thereby heating the supply air into the exhaust air before the exhaust air exits that building, wherein the first end of the first building is a closest end to the second building and the first end of the second building is a closest end to the first building, wherein the first end of the first building and the first end of the second building form portions of a supply air corridor between the first building and the second building, wherein each floor contains at least some of the multiple computing devices arranged in racks having a supply air side and an exhaust air side, the supply air side and the exhaust air side alternating between adjacent floors, and wherein at least one of the buildings comprises at least one grate disposed between the adjacent floors and configured to allow a portion of the supply air to flow from the exhaust air side of a lower floor to the supply air side of a higher floor that is adjacent to the lower floor when a temperature of the portion of the supply air meets a temperature requirement for the higher floor.

13. The method of claim 12, wherein, for each building:

the first end of the building comprises a first damper or vent disposed on an exterior wall of a first floor, the first damper or vent configured to allow the supply air to enter the building, the second end of the building comprises a second damper or vent disposed on an exterior wall of another floor, the second damper or vent configured to allow the exhaust air to exit the building, and the other floor is higher than the first floor.

14. The method of claim 12, further comprising wherein:

automatically opening the at least one grate when the temperature requirement is met.

15. The method of claim 12, further comprising:

at each building, operating one or more fans to promote movement of the supply air into that building or movement of the exhaust air out of that building.

* * * * *